United States Patent [19]

Brantingham

[11] 4,100,606
[45] Jul. 11, 1978

[54] KEY DEBOUNCE SYSTEM FOR ELECTRONIC CALCULATOR OR MICROPROCESSOR

[75] Inventor: George Lawrence Brantingham, Richardson, Tex.

[73] Assignee: Texas Instruments Incorporated, Dallas, Tex.

[21] Appl. No.: 767,086

[22] Filed: Feb. 9, 1977

[51] Int. Cl.$^2$ .......................... G06F 3/02; G06F 9/00
[52] U.S. Cl. .................................. 364/900; 364/709; 340/365 E
[58] Field of Search ................... 340/365 E; 235/152, 235/156; 364/200 MS File, 900 MS File, 709

*Primary Examiner*—James D. Thomas
*Attorney, Agent, or Firm*—Rene E. Grossman; Richard P. Berg

[57] ABSTRACT

A key debounce system for an electronic calculator or microprocessor system, wherein the calculator or microprocessor has a data memory for storing numeric data, an arithmetic unit for performing arithmetic operations on the data stored in the data memory, a program counter, an instruction memory for storing a plurality of instruction words controlling the operation of the microprocessor or calculator, one of the plurality of instruction words being outputted once each instruction cycle of the system according to an address stored in the program counter and a keyboard sensing circuit for interfacing the system with a keyboard. The key debounce system comprises a circuit for loading a starting instruction word address in the program counter, the starting instruction word address being generated according the the sensing of the depression of a key at the keyboard by the sensing circuit, the starting instruction word address being the first address of a set of instruction words controlling the system to perform the function indicated by the key depressed, and a disabling circuit for disabling the circuit loading the starting instruction word address after the sensing circuit has detected a key depression until an instruction word toward the end of the set of instruction words is outputted and no additional key depression is detected by the sensing circuit for a preselected period having a duration of a plurality of the aforementioned instruction cycles.

20 Claims, 33 Drawing Figures

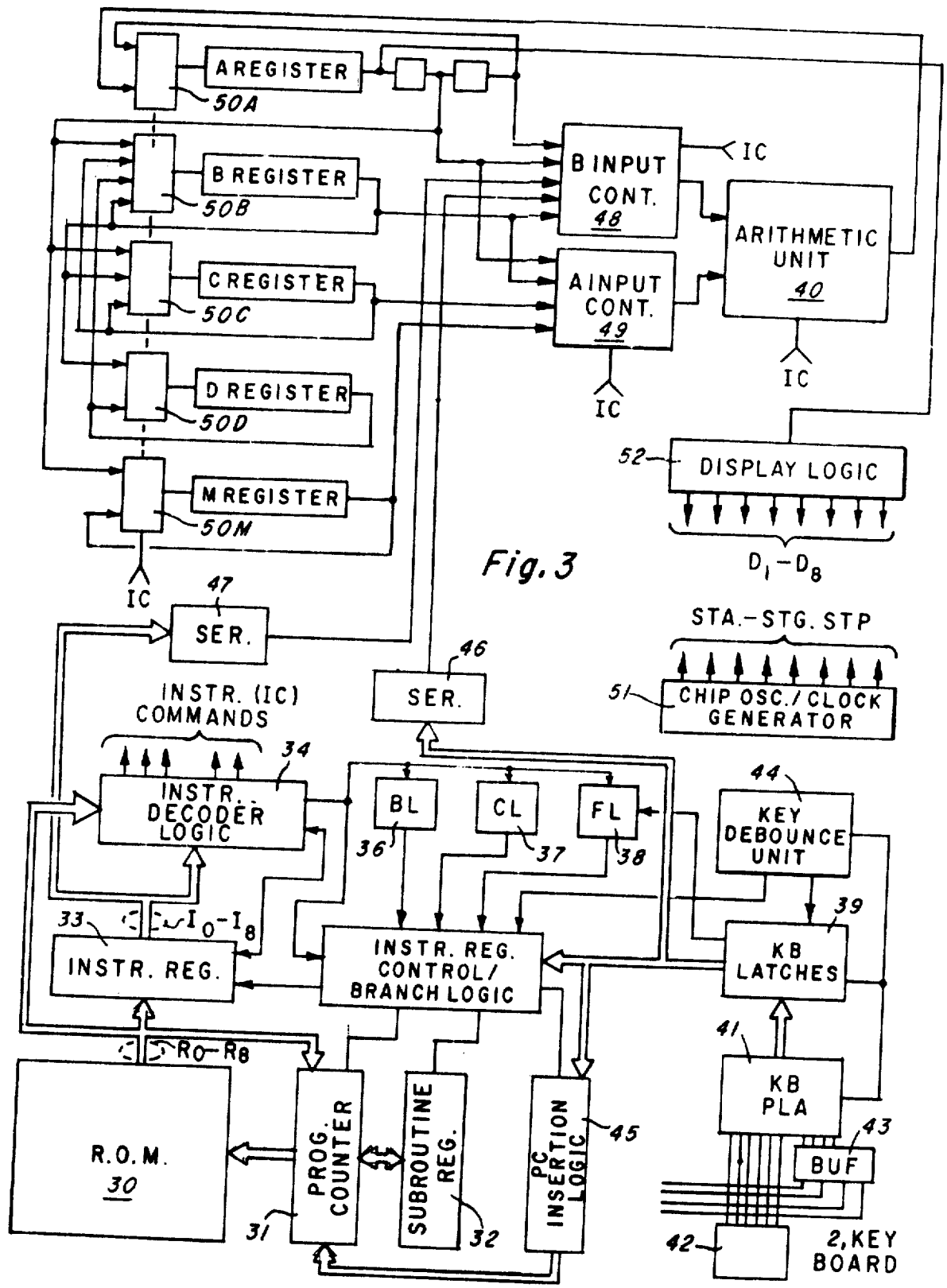

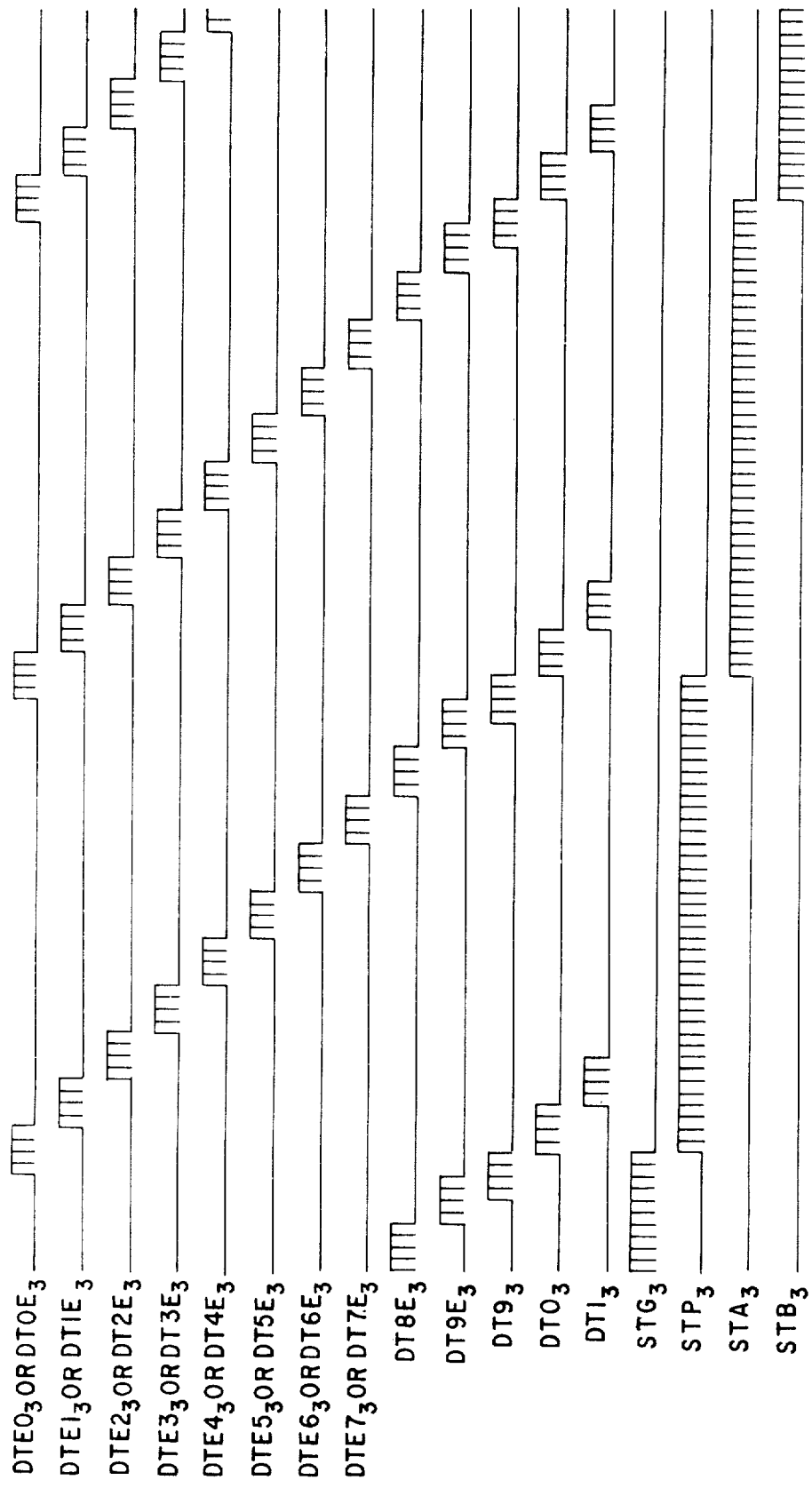

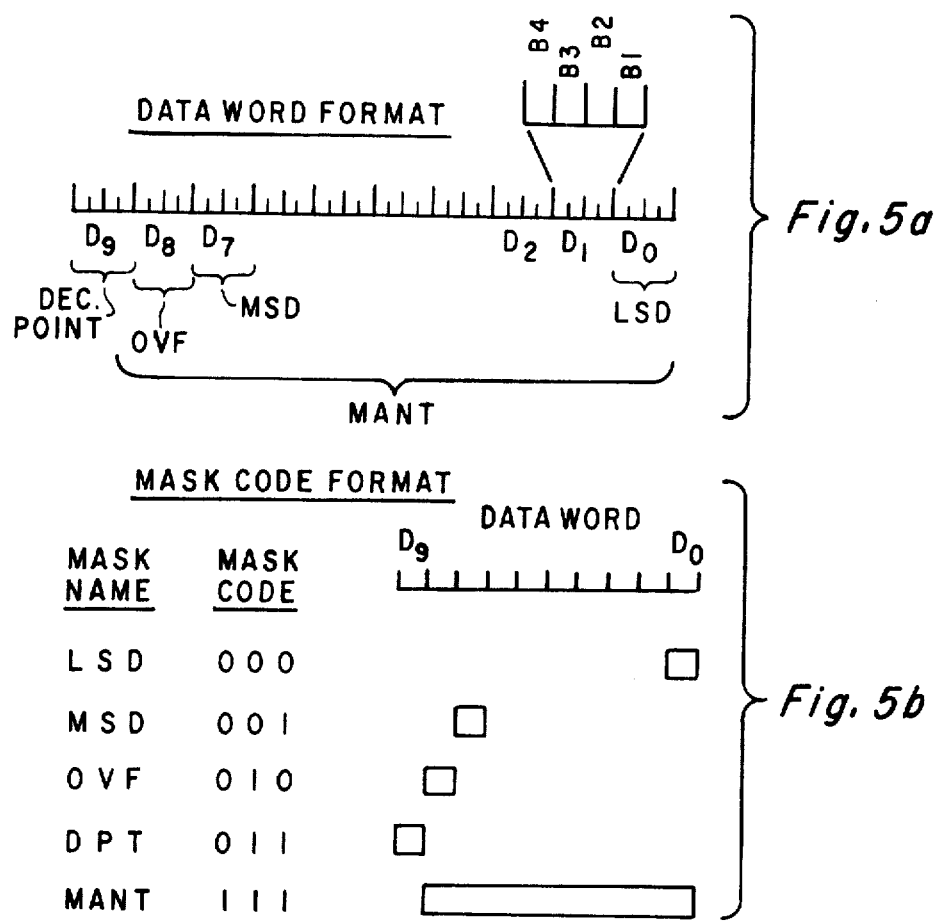

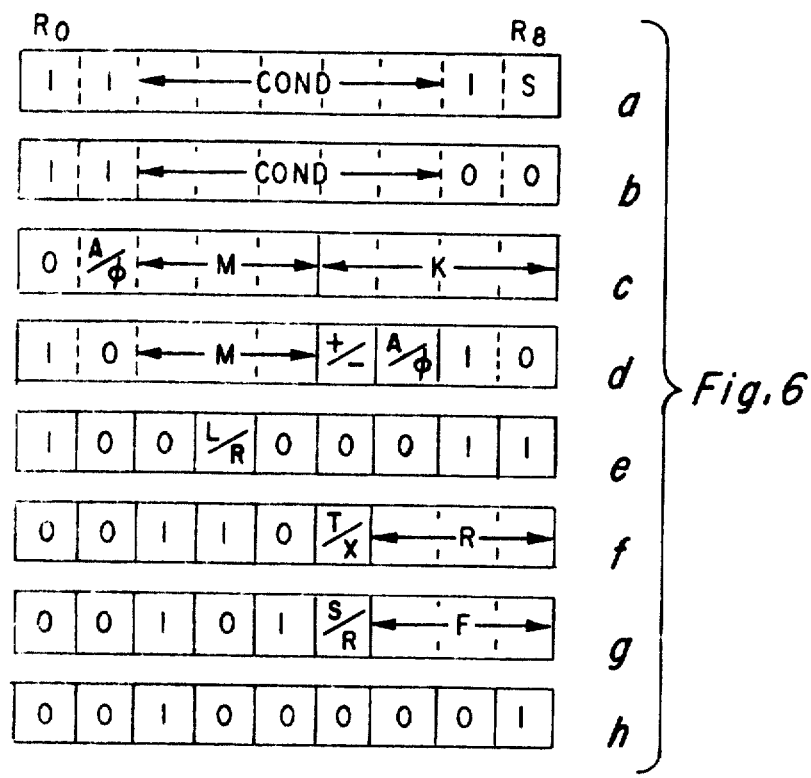
Fig. 6
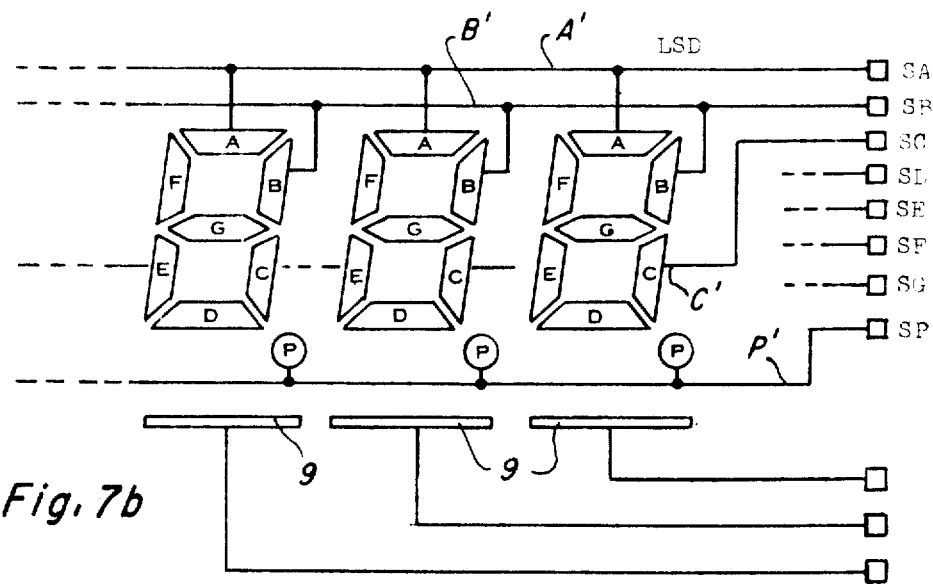
Fig. 7a
Fig. 7b

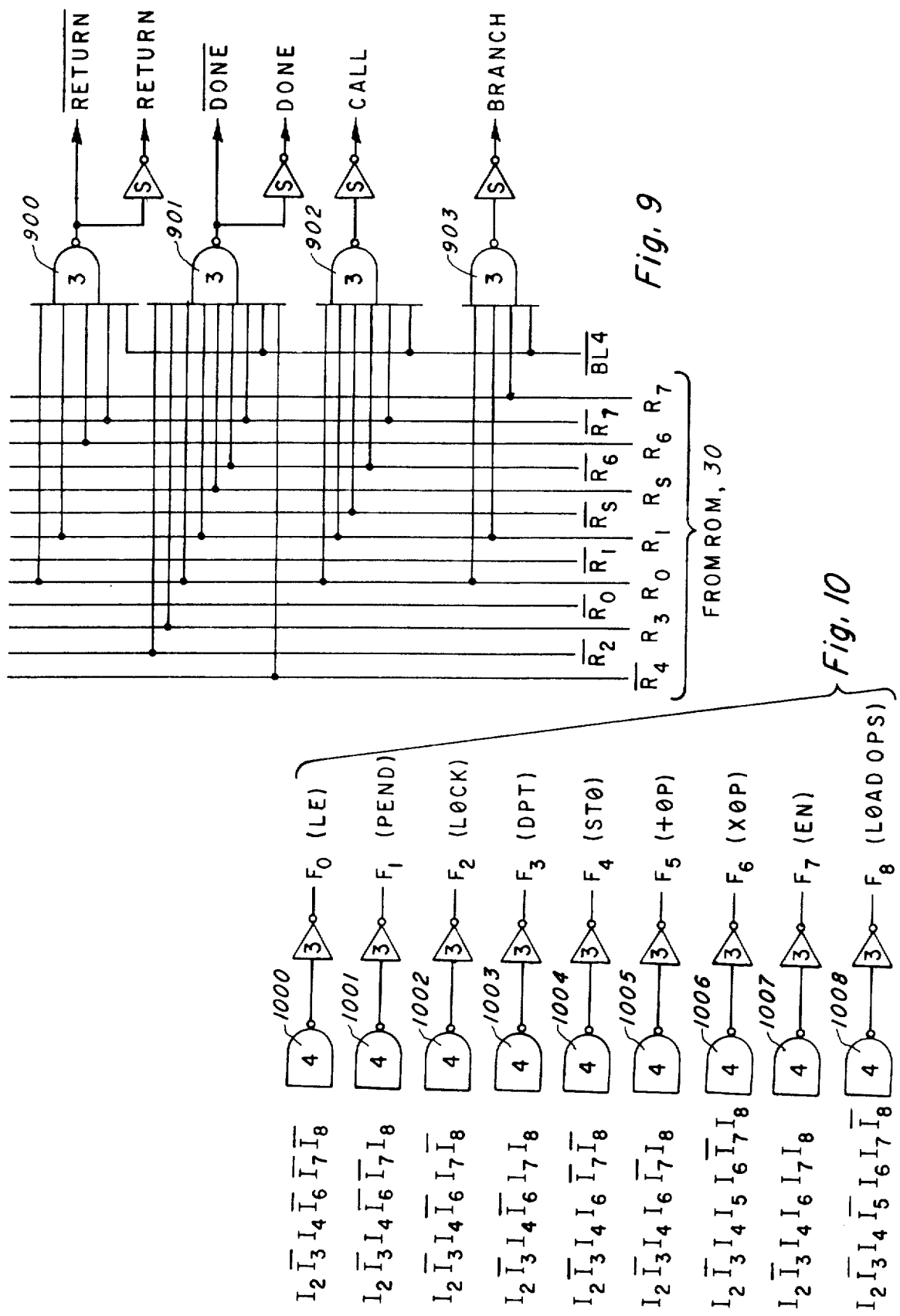

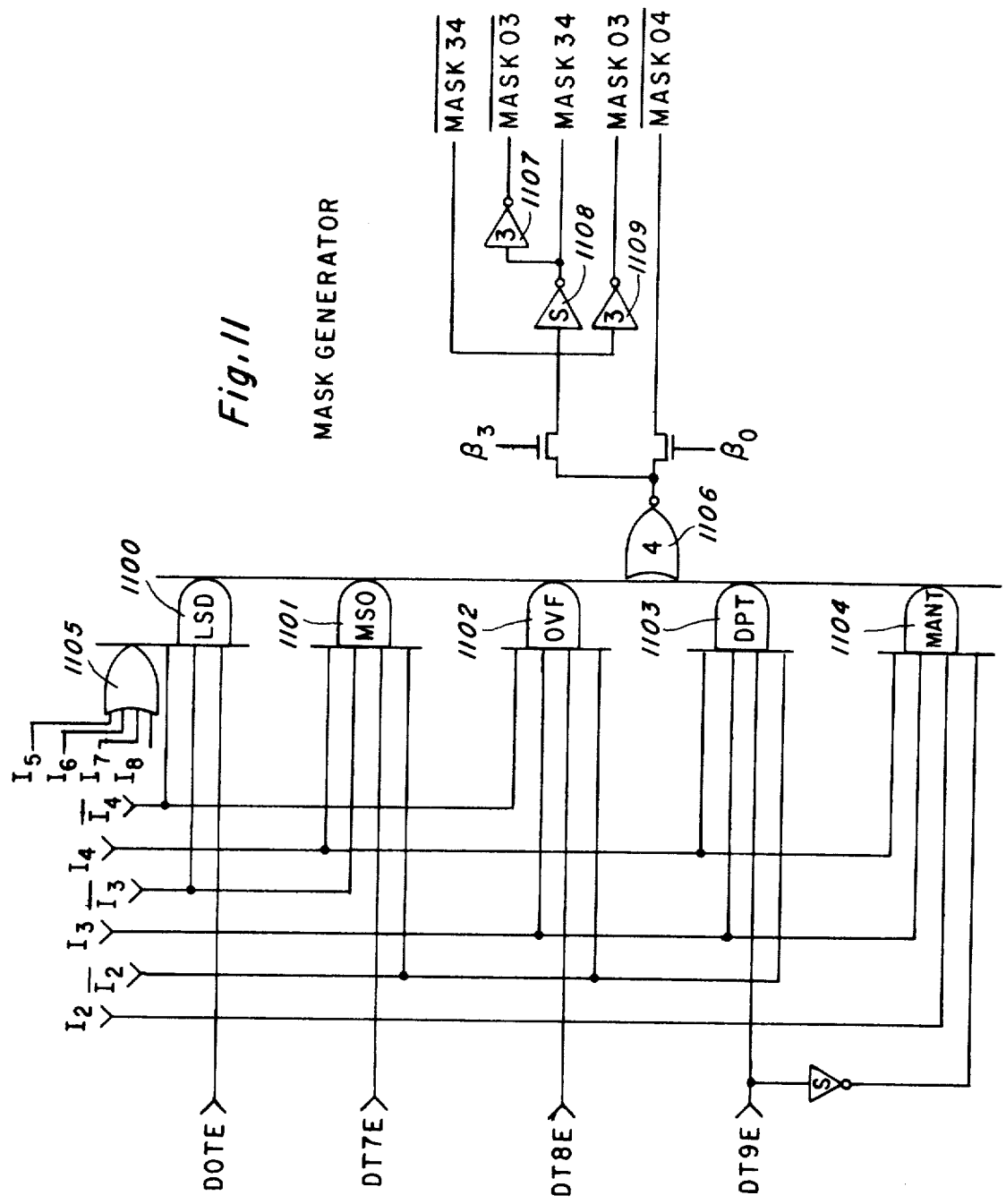
Fig. 11  MASK GENERATOR

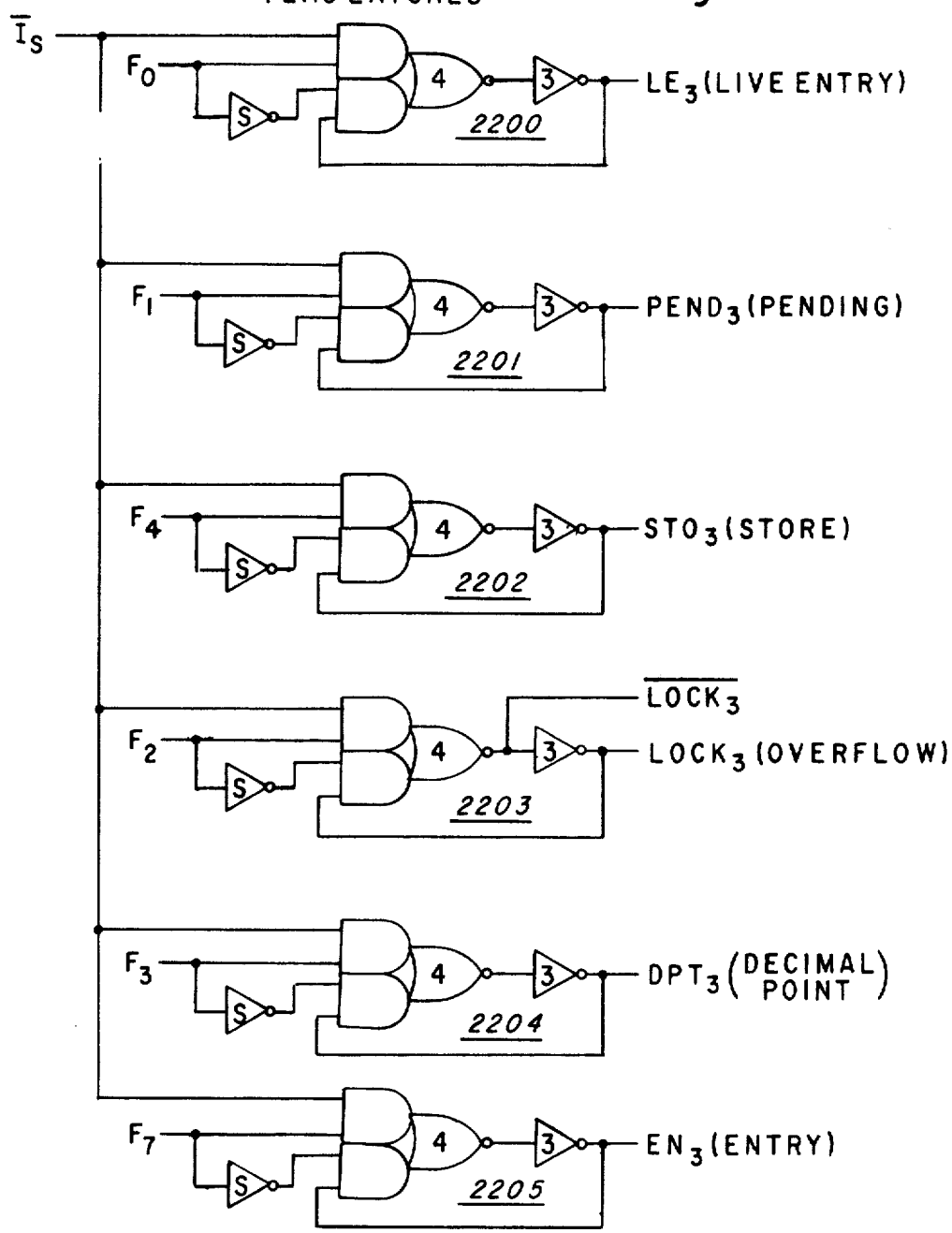

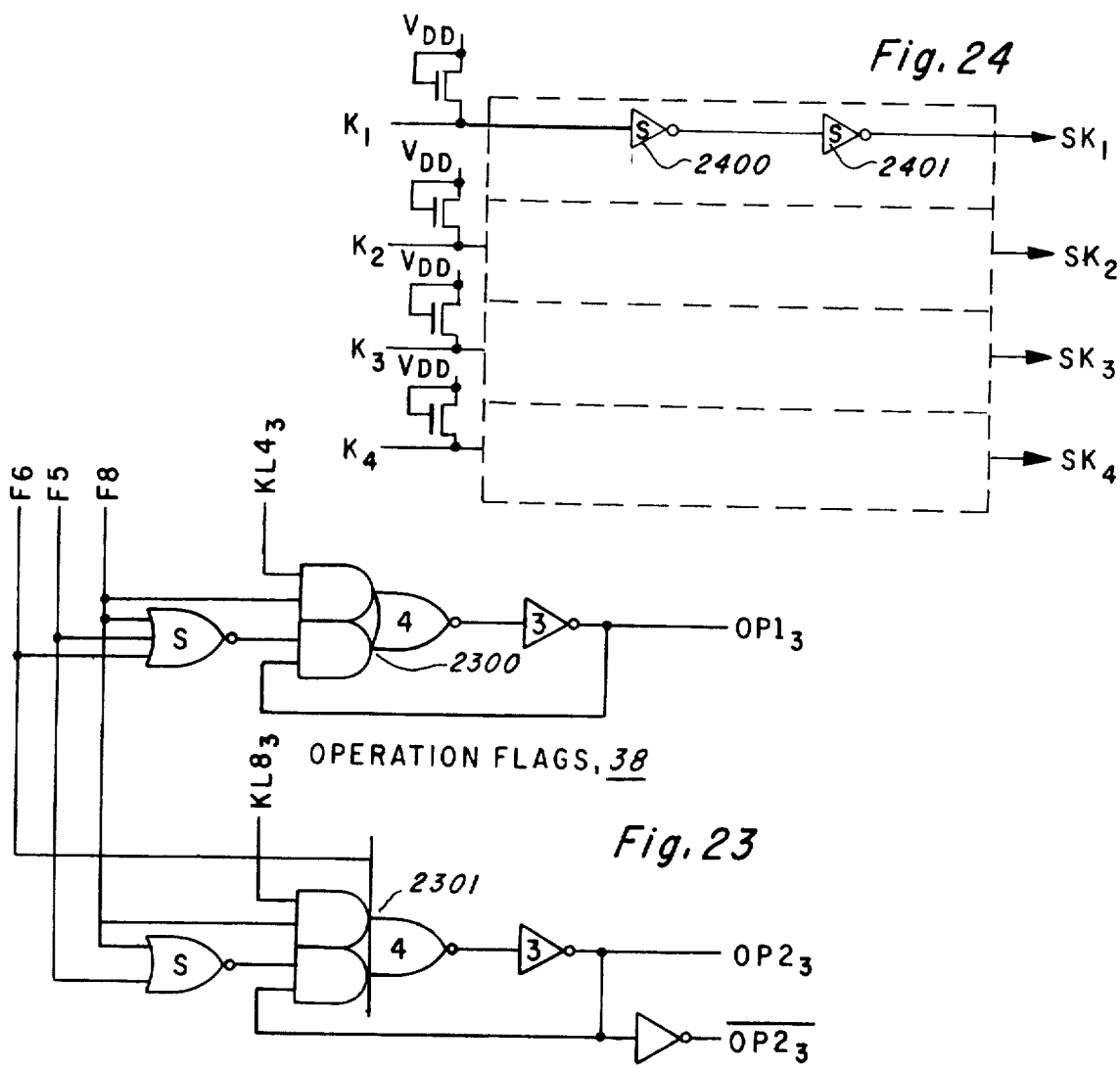
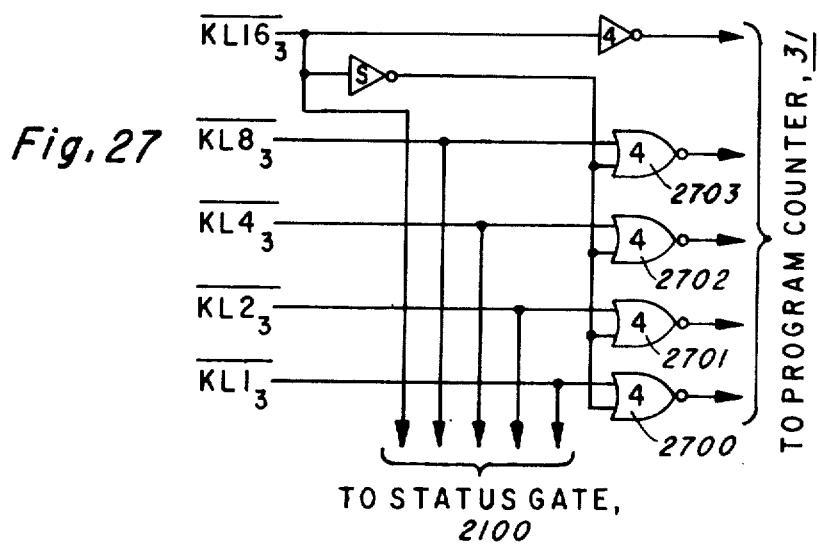

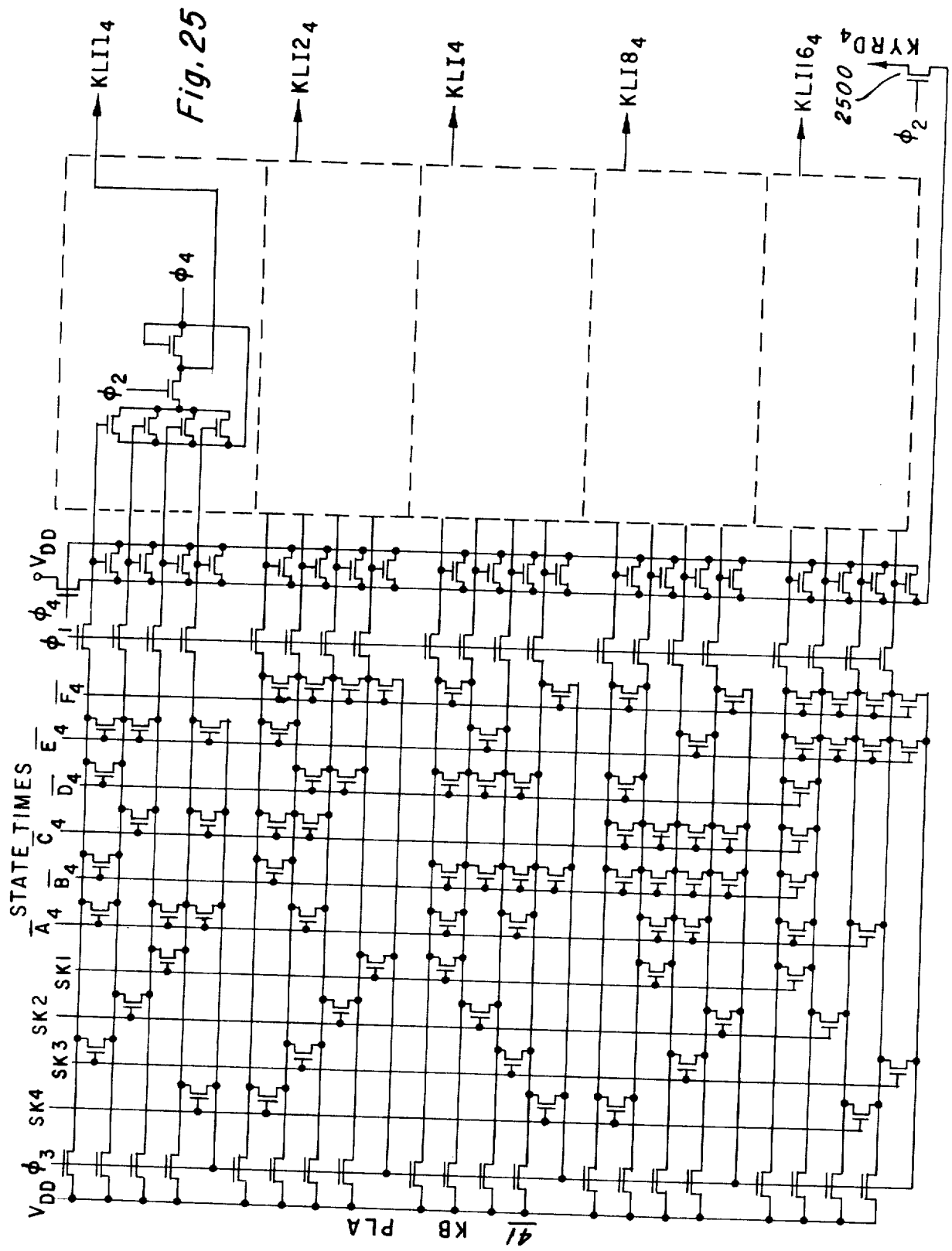

KEY DEBOUNCE SYSTEM FOR ELECTRONIC CALCULATOR OR MICROPROCESSOR

BACKGROUND OF THE INVENTION

Electronic calculator systems of the type wherein all the main electronic functions are integrated on a single integrated semiconductor chip wherein a small number of such chips are described in the following U.S. patents, which are assigned to the assignee of this invention:

U.S. Pat. No. 3,919,532 issued to Michael J. Cochran and Charles P. Grant on Nov. 11, 1975 and entitled "Calculator System Having An Exchange Data Memory Register,"

U.S. Pat. No. 3,934,233 issued to Roger J. Fisher and Jerald D. Rogers on Jan. 20, 1976 and entitled "Read-Only-Memory for Electronic Calculator,"

U.S Pat. No. 3,931,507 issued to George L Brantingham on Jan. 6, 1976 and entitled "Power-Up Clear in Electronic Digital Calculator,"

U.S. Pat. No. 3,988,604 issued to Joseph H. Raymond, Jr. on Oct. 26, 1976 and entitled "Electronic Calculator or Digital Processor Chip Having Multiple Function Arithmetic Unit Output."

The concepts of these prior applications have made possible vast reductions in the cost of the small personal-sized calculators. Continuing efforts to reduce the cost of these products include the development of a calculator chip utilizing minimum semiconductor chip area and which is capable of performing addition, subtraction, multiplication, division, squaring, square rooting, percent and memory operations. The chip disclosed herein may be utilized in hand-held or desk model calculators capable of performing operations of the aforementioned types and may be implemented on a very small semiconductor chip.

The present invention relates to a key debounce system for a microprocessor and, more specifically, a key debounce system for an electronic calculator implemented on a semiconductor chip. An entire electronic calculator system which uses the key debounce system of this invention is disclosed. The electronic calculator system is a serially, word organized calculator; however, the invention is not limited to this type calculator, but rather may be utilized with microprocessors generally which interface with a keyboard or other such input means. A key debounce system is used to inhibit an unintented double entry which might otherwise occur if the key switches at the keyboard bounce when actuated.

In the prior art, as exemplified by U.S. Pat. Nos. 3,919,532; 3,931,507 or 3,988,604 key debounce was controlled by instructions stored in the system's instruction memory. These instructions typically test the state of a latch or flag which is set in response to operation of the calculator's keyboard. The state of the flag or latch is periodically tested to help assure that the calculator or microprocessor ignores key bounces but inputs intended second operations of the same key.

It has been found that the efficacy of these prior art key debounce systems is dependent upon the frequency of the system's clock. That is, within a relatively narrow clock frequency range, such prior art key debounce systems could be made to operate effectively; however, their efficacy was reduced as the variability of the system's clock frequency increased. While this may be of little consequence for a system which uses external means, such as an external resistor or crystal, to control the system's clock frequency, it is of great importance where the system's clock frequency is totally controlled by means of the system's chip or chips. Because of the different variables which enter into the fabrication of a chip, a chip's clock frequency can vary substantially and because it would be undesirable to discard chips otherwise operable whose clock frequency is outside some predetermined narrow range, it is desirable to have a key debounce system having high efficacy over a relatively wide range of system clock frequencies. The use of chips having no external frequency control means is desirable because of the resulting reduction of number of components needed to construct the calculator or microprocessor system.

It was therefore one object of this invention to improve key debounce systems for use with an electronic calculator or microprocessor.

It is another object of this invention to provide a reliable key debounce system for use with an electronic calculator or microprocessor whose clock frequency may vary over a relatively wide range.

It is still another object of this invention to improve key debounce systems used with electronic calculators or microprocessors such that the system's clock generator need no external means to control clock frequency.

The foregoing objects are achieved according to the present invention as is now described. In a preferred embodiment of the invention, an electronic microprocessor or calculator system having a data memory for storing numeric data, an arithmetic unit for performing arithmetic operations on the data stored in the data memory, a program counter, an instruction memory for storing a plurality of instruction words controlling the operation of the microprocessor calculator, one of the plurality of instruction words being outputted once each instruction cycle of the system according to an address stored in the program counter and a keyboard sensing circuit for interfacing the system with a keyboard, is provided with a key debounce system. The key debounce system includes a circuit for loading a starting instruction word address into the program counter, the starting instruction word being generated according to the sensing of the depression of a key at the keyboard by the sensing circuit, the starting instruction word address being the first address of a set of instructions controlling the system performing the function indicated by the key depressed. The key debounce system also includes a disabling circuit for disabling the circuit loading the start instruction word address after the sensing circuit has detected a key depression until an instruction word toward the end of the set of instruction words is outputted and no additional key depression is detected by the sensing circuit for a preselected period having a duration of a plurality of the aforementioned instruction cycles. The enabling circuit, by being continually sensitive to the lack of an additional key depression during a continuous period having the aforementioned plurality of instruction cycles desensitizes the key debounce system to variations in the system's clock frequency. For instance, in the embodiment subsequently disclosed, the frequency of the oscillator in the clock generator may vary from 150KHz to 800KHz with little effect on the efficacy of the disclosed embodiment of the key debounce system.

BRIEF DESCRIPTION OF THE DRAWINGS

The novel features believed characteristic of the invention are set forth in the appended claims. The invention itself, however, as well as the preferred mode of use, further objects and advantages thereof, will best be understood by reference to the following detailed description of an illustrative embodiment when read in conjunction with the accompanying drawings, wherein:

FIG. 3 depicts a functional block diagram of a single chip calculator system embodying the present invention;

FIGS. 4a and 4b depict the timing singals generated by a clock generator implemented in the calculator system, the timing signals being shown in representative form;

FIGS. 5a and 5b depict the form of the data words stored in the data memory registers of the calculator system, the mask codes which are used in the instruction words implemented in the read-only-memory, and how these various masks relate to the data words;

FIGS. 6a-6h depict the form of the various instructions words described in Table I;

FIGS. 7a and 7b depict a segmented display and a manner in which the calculator system may be interconnected therewith;

FIG. 9 is a logic diagram of that portion of instruction word decoder logic for decoding return, done, call, and the branch family of instructions;

FIG. 10 is a logic diagram of that portion of instruction word decoder logic for decoding flag instructions;

FIG. 11 is a logic diagram of the mask generator portion of instruction word decoder logic;

FIGS. 22 and 23 are logic diagrams of the calculator's flag latches;

FIG. 24 is a logic diagram of the keyboard buffers;

FIG. 25 is a logic diagram of the keyboard programmed logic array;

FIG. 27 is a logic diagram of the key latch to program counter insertion logic.

DESCRIPTION OF THE PREFERRED EMBODIMENT

Figure 1:
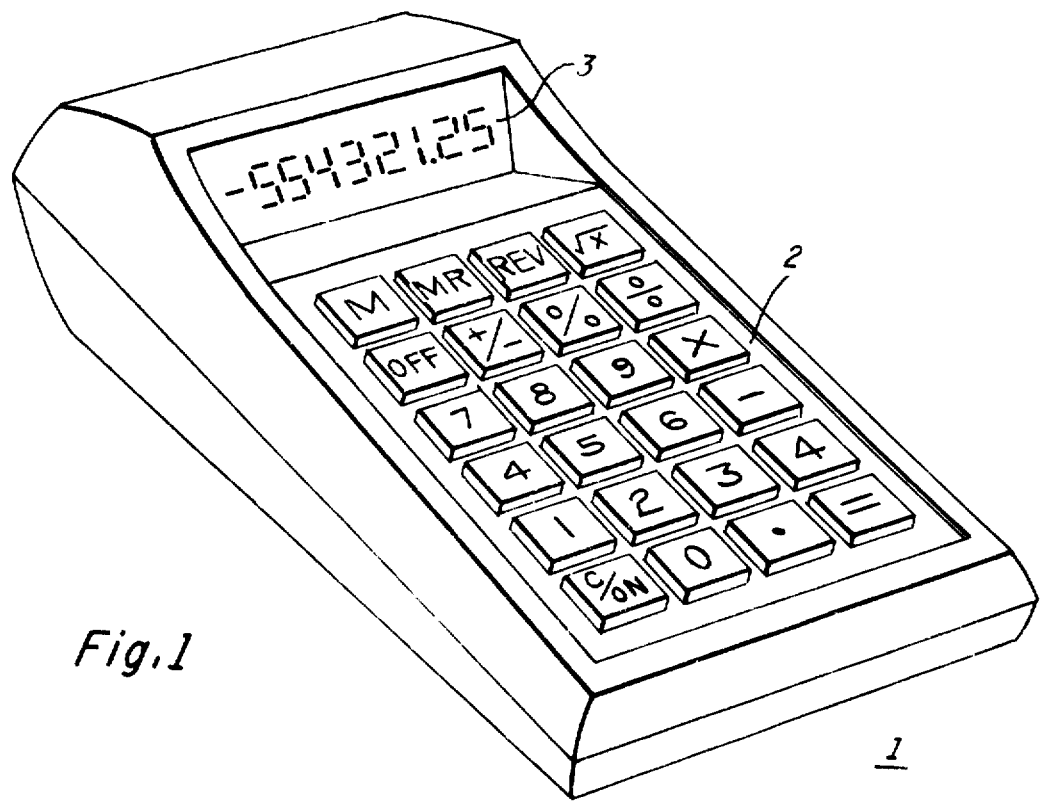
FIG. 1 is a pictorial view of a portable, electronic, hand-held calculator of the type which may embody the present invention.

Referring now to FIG. 1, an electronic portable calculator of the type which may employ features of this invention as shown in pictorial form. The calculator 1 includes a keyboard 2 and a display 3. The display, in one embodiment, consists of eight digits or characters, provided by an array of light emitting diodes, a flourescent tube, liquid crystal devices or other display means. Each of the characters in the display is preferrably implemented as a conventional segmented character, seven segments preferably being provided for character with an additional segment being provided adjacent to each character for displaying a decimal point. The keyboard 2 or other such input means preferably includes a set of numbers keys (0-9), a decimal point key (.), and a plurality of function keys including, for example, addition (+), subtraction (−), division (÷), multiplication (×), square root ($\sqrt{\ }$), clear (c), and square ($x^2$) keys. Further, keys may be provided for memory functions, including such keys as memory operations (M) and memory recall (MR).

Figure 2:
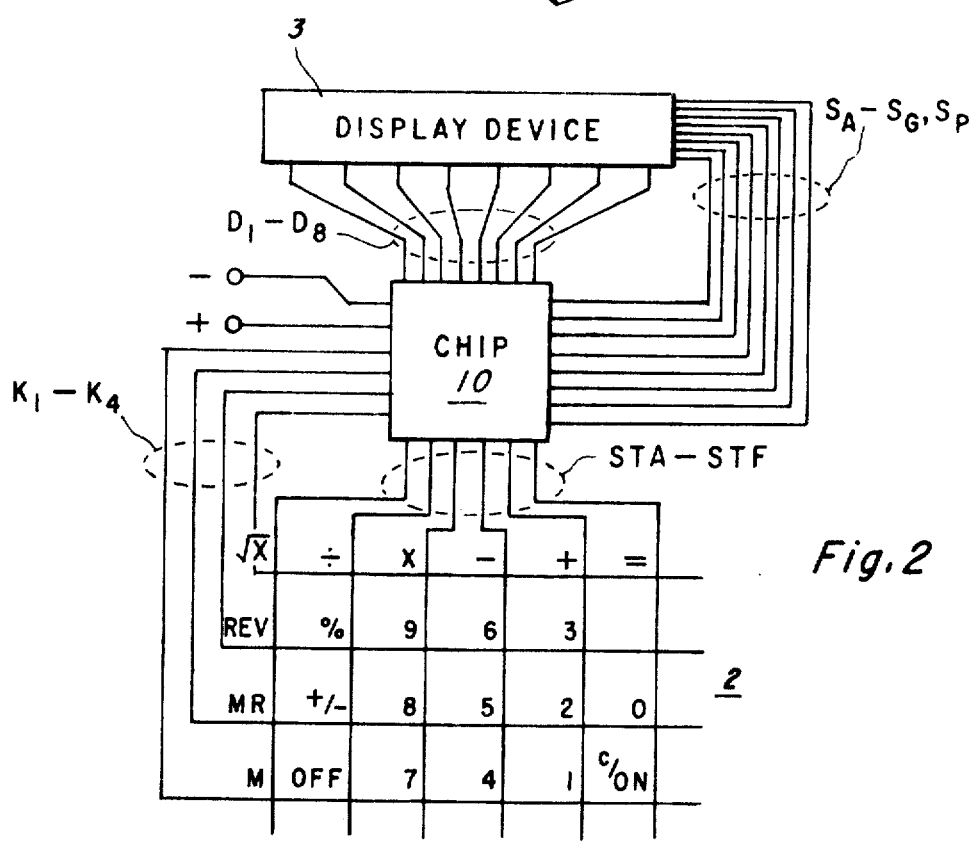
FIG. 2 is a functional schematic diagram of a single chip calculator system of the type embodying the present invention.

Referring now to FIG. 2, there is shown a functional schematic diagram of a single chip calculator system of the type emboding the present invention. The single chip 10 shown here is disposed in a twenty-eight pin package. Of course, techniques are known for reducing the number of such pins, for instance by combining the lines for scanning a display and the lines for scanning the keyboard, as taught in U.S. Pat. No. 3,984,816, which is assigned to the assignee of this invention. However, it has been found the design of the circuit board of substrate to which calculator chip 10 is affixed may be simplified if the circuit pattern implemented thereon does not have any cross-over points. If cross-over points are required, then the circuit board or substrate must be equipped with jumper wires, double layered wiring or multi-level wiring, all of which complicate the manufacture of the circuit board or substrate. As can be seen from FIG. 2, by using a 28 pin package for chip 10 the need for such cross-over points is avoided. Keyboard 2 may be implemented avoiding such cross-over points in the manner disclosed in U.S. Pat. No. 3,911,234, for instance.

Referring now to FIG. 3, there is shown a functional block diagram of the single chip calculator system embodying the present invention showing the various circuits implemented on chip 10. While a detailed description of the various circuits will be subsequently given with regard to FIGS. 8-29, a general functional description of the basic system is set forth here with regard to FIG. 3. It is to be understood that with regard to the block diagram in FIG. 3, a connection represented by a single line may represent a plurality of actual hardware interconnections and for ease and simplicity of illustration, a single line may represent a plurality of different functions. Extra width lines, such as that between ROM 30 and instruction register 33, are used to denote parallel data paths used in this embodiment of the present invention. While the calculator's registers (A–D, M) and arithemtic unit 40 operate serially, it is to be understood that many features of this calculator are not limited to the use of either parallel or serial data paths unless so set forth in the appended claims.

The calculator system of the invention includes an instruction word memory, preferably an instruction word read-only-memory (ROM 30). ROM 30 is responsive to a nine bit address ($PC_0$–$PC_8$), stored in a program counter 31 and produces, in response thereto, a nine bit instruction word ($R_0$–$R_8$), which is provided to an instruction word decoder logic 34 and to an instruction word register 33. Program counter 31 normally increments in a pseudorandom fashion and addresses ROM 30. The instruction word ($I_0$–$I_8$) loaded in the instruction register 33 corresponds to the instruction word ($R_0$–$R_8$) outputted from ROM 30 except that instruction words corresponding to branch, call, return or done instructions are not loaded into instruction register 33. Instead of receiving a branch, call, return or done instruction, a no-operation (NO-OP) instruction is loaded therein, by the action of instruction register control/branch logic 35. As will be seen, those portions of instruction word decoder logic 34 decoding BRANCH, CALL, DONE, or RETURN instructions are responsive to the $R_0$–$R_8$ instruction word from ROM 30 while other portions of logic 34 are responsive to the $I_0$–$I_8$ instruction word from instruction word register 33. Further, the instruction word following a branch or call instruction, which corresponds to the address of the branch location, is also inhibited from entering the instruction register 33 when branch latch 36 is set.

The branch address instruction word which follows a branch instruction is loaded into program counter 31 as the branch address when either (1) the branch instruction is an unconditional branch instruction or (2) the branch instruction is a conditional branch instruction and the condition has been satisfied. Instruction register control/branch logic 35 tests the state of a selected flag latch 38, a carry latch 37, a "first" latch 2600 (FIG. 26) or a combination of selected keyboard latches 39 when a conditional branch instruction is encountered. In section A of Table I, the various branch instructions are listed, indicating the various flags and latches upon which a branch can be conditioned. Since the instruction words preferably have nine digits, the branch address instruction is directly inserted into program counter 31 when a branch or call is executed.

Branch latch 36 is set by either the decoding of a BRANCH instruction or a CALL instruction (See Sections A and B of Table I) and is used to inhibit the branch address from being loaded into instruction register 33 or being decoded by these portions of instruction word decoder logic 34 which are responsive to the R0–R8 instruction word. A CALL instruction is a specialized type of unconditional branch instruction in as much as the next instruction word is utilized as the branch address loaded into program counter 31; additionally however, the address to which program counter 31 would have normally incremented is stored in the subroutine register 32. Upon encountering a RETURN instruction, the contents of subroutine register 32 is loaded into program counter 31 under control of instruction register control/branch logic 35. The DONE instruction is an important feature of this calculator system which inhibits incrementing of the address stored in program counter 31. Further, the DONE instruction is not loaded into instruction register 33, but rather the contents of instruction register 33 is automatically zeroed which corresponds to a no-operation (NO-OP) instruction. The key latches 39 which provide a key memory means for storing a five bit code, are loaded from a keyboard PLA 41 which decodes inputs provided from keyboard sensing strobe 42 via buffers 43 and keyboard 2, thereby decoding key pushes at keyboard 2. Keyboard latches 39 store a code indicative of the last key depressed at keyboard 2.

Debounce Logic 44 is provided for hardware debouncing key pushes at keyboard 2. The outputs of the keyboard latches 39 may be inserted into program counter 31 via Program Counter (PC) Insertion Logic 45 under control of instruction register/branch logic 35 or may be inputted to arithmetic unit 40 via a serializer 46 when a Keyboard Latch to Register A Instruction (Section G, Table I) has been decoded.

A portion of the instruction word stored in the instruction register 33 is loaded via serializer 47 into B Input Control 48 for Arithmetic Unit 40 for selected arithmetic operations involving a constant (See Section C, Table I).

A data memory is provided by shift registers A–D and M which are used for storing ten digit data words having the format shown in FIG. 5A. Only the A and B registers may be inputted into arithmetic unit 40 (via A input control 49 and B input control 48, respectively) for addition or subtraction operations. The C register and M register interconnections with A input control 49 are used for exchanging the data with the A register, which exchanges are carried out via arithmetic unit 40 but arithmetic unit 40 is not then used to alter the data. The register input logics 50A–50D and 50M are used to provide recirculation paths and data transfer/exchange paths. Input logic 50A preferably receives the output from arithmetic unit 40 and thus register A is preferably the only register from which the output arithmetic unit 40 may be directly supplied. Thus in the preferred embodiment of the calculator, only the contents of the A and B registers may be directly supplied to the arithmetic unit 40 for arithmetic operations and the results of such arithmetic operations may only be directly provided back to the A register. The contents of the other registers, C, D and M, may be operated upon if the contents of Registers A or B are inserted into Registers A or B. The contents of the C register may be inserted into A register, or the contents of the A register may be inserted into the C register or the contents of the A and C registers may be exchanged. Similarly, the contents of the B register may be inserted in either the C or D registers or exchanged with either of those registers. Also, the contents of the M register may be inserted in the A register or exchange therewith. While these limitations on how the various registers, A–D and M, may be inputted to the arithmetic unit or manipulated to transfer data therebetween tend to increase the number of instructions required for performing arithmetic operations, it has been found that the clip silicon area saved by (1) limiting the hardware interconnections between the various registers and the arithmetic unit and (2) limiting the number of different types of instructions which must then be decoded more than makes up for the additional silicon area used for providing extra instructions in ROM 30. These extra instructions occur, for instance, because before the contents of register D may be manipulated in the arithmetic unit, the contents of register D must first be inserted or exchanged with the contents of register B, thereby adding an additional register instruction before an arithmetic instruction. However, with a calculator performing, in the main, simple arithmetic functions, this technique results in a net savings of silicon area required to implement the calculator chip.

The contents of Register A is outputted to display 3 via display logic 52 which decodes the contents of Register A for energizing appropriate segments of display 3.

SYSTEM TIMING

Figure 4A:
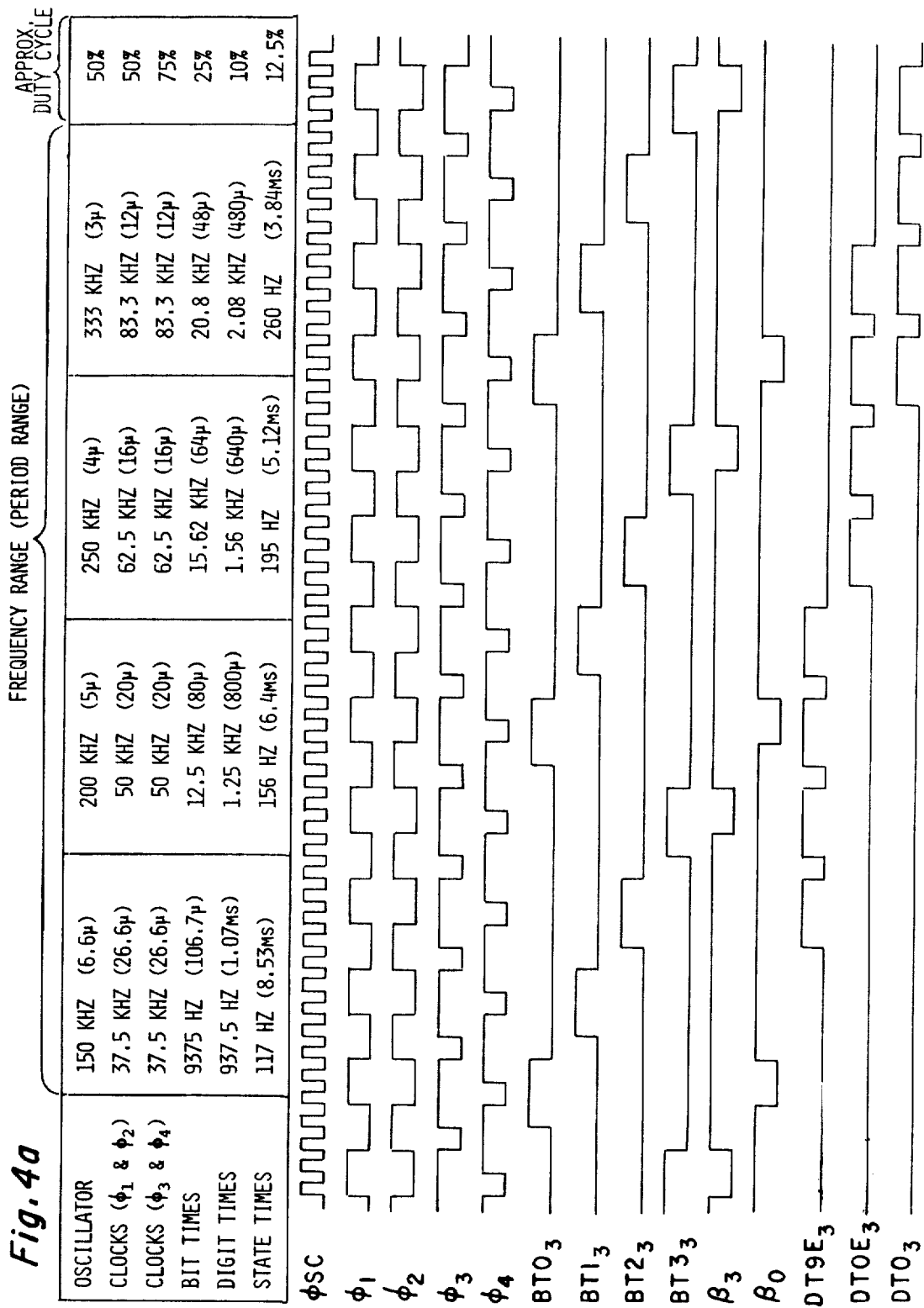

Referring now to FIGS. 4a and 4b, there is shown, in representative form, the timing signals generated by the clock generator 51 implemented on chip 10. The clock generator's oscillator preferably has a frequency in the range of 150 KHz to 333 KHz, with a nominal frequency of 200 KHz. As is shown in FIG. 4a, there are two main clock phases ($\phi 1$ and $\phi 2$) and two precharge clock phases ($\phi 3$ and $\phi 4$). Phase $\phi 3$ goes low during the first half of phase $\phi 1$ and serves as a precharge therefor. Phase $\phi 4$ goes low during the first half of phase $\phi 2$ and serves as a precharge therefor. The bit times BT0–BT3 each comprise a period equal to $\phi 1$ plus $\phi 2$, that being the period of time for clocking one bit of data in the calculator. Four bit times, BT0 to BT3, comprise the time necessary to clock one digit of data (of four bits) and thus comprise a digit time. As digit times, DT0–DT9, each provide a period of time for clocking one digit (either binary corrected decimal or hexadecimal) in the calculator, the period of ten digit times DT0 to DT9 provide the time for clocking all ten digits in the data words. Early digit times, DT0E–DT9E, correspond to digit times DT0–DT9, but are generated two bit times early. Ten digit times (DT0 to DT9) comprise an instruction cycle having a period of 640 microseconds at a nominal clock frequency of 200 KHz. Successive instruction cycles are labeled state times A–G and P (STA – STG and STP) in as much as the segments A–G and P in the display are repeatively enabled during state times A–G and P occurring during display operation. Beta times $\beta 0$–$\beta 3$ correspond to bit times BT0–BT3 but are inverted and are shortened by the period of the $\phi 3$ precharge clock cycle.

The calculator embodying the present invention uses four phase MOS logic which eliminates need for most power supply lines on the chip but requires that the precharge times be carefully selected to eliminate possible race conditions. Thus for clocked gates connected in series, the gate level should be inverting and a gate which is precharged on phase $\phi 3$ should drive a gate precharged on phase $\phi 4$ and conversely a gate precharged on phase $\phi 4$ should drive a gate precharged on phase $\phi 3$. Gates having the same precharge phase however may be connected in series if a static inverter is interposed between them. In the drawings of the detailed logic diagrams of the chip 10, the clocked gates are shown with a numeral three or four to indicate which precharge cycle, $\phi 3$ or $\phi 4$, that particular gate is driven on. Static gates are shown with an "S." The signals from the gates are often provided with a subscript indicating which precharge cycle, $\phi 3$ or $\phi 4$, that signal was generated on. While this precharge logic is utilized to conserve chip silicon area and to reduce power consumption, the features of the calculator disclosed are not dependent on the use of such logic.

According to the aforementioned convention, bit times labeled $BT0_3$, $BT1_3$, etc, indicate that the bit time is zero or one, as indicated, and that the signal was generated from a gate driven on a phase $\phi 3$, precharge. The detailed logic diagrams of FIGS. 8–29 also use some timing signals not previously described; for instance, timing signal 923 indicates digit times 9, bit time 2 from a gate operated on a phase $\phi 3$ precharge. The same convention is used with other timing signals having three numerals.

INSTRUCTION SET

Table I lists the instructions which may be programmed into ROM 30 for controlling the operation of the calculator. A set of instruction words storable in ROM 30 for implementing this calculator is shown in Table II. Referring now to Table I, it can be seen that Table I is divided into Sections A–G for describing various instruction word types. Each instruction word type refers to one of FIGS. 6a–6h, which shows the format of each set instruction type.

Branch instructions (Section A) indicate whether the branch is conditional and if conditional on which flag or latch the branch is to be conditioned. The status bit, S, is used to indicate whether conditional branches are to be executed based on whether the selected flag or latch has been reset or set. The instruction word immediately following a branch instruction or a call instruction provides the address to be inserted into program counter 31. It should be noted that the length of an instruction word is nine bits and that the length of the program counter is likewise nine bits. Conventionally, the branch address was included as part of the branch instruction, which typically forced the instruction word to be longer than the address loaded into program counter 31. It has been found, however, that a more efficient use of available chip silicon area may be made if the instruction word is shortened to the same length as the program counter address. This may be accomplished by utilizing a two instruction cycle branch wherein the first instruction word is a branch instruction and the second instruction word is a branch address. This is an important feature of this invention for reducing the amount of silicon area used to implement an electronic calculator chip.

The formats of subroutine and done instructions, whose functions have previously been described, are described in Section B of Table I.

The arithmetic instructions, Section C of Table I, are limited to operations involving register A and a constant or operations involving A and register B. As has been previously discussed, this is an important feature of this invention for reducing the total amount of chip silicon area acquired to implement an electronic calculator. The masks which may be generated for the arithmetic instructions are shown in FIG. 5b. The sections D through G of Table I list the instructions for performing shifts on the contents of register A, for interchanging the various registers with one another, for setting and resetting selected flags and for inserting the contents of the key latches 39 into the A register.

DATA WORD FORMAT AND ASSOCIATED MASKS

Referring now to FIG. 5a, there is shown the format of the data words stored in registers A–D and M. As aforementioned, each data word comprises ten digits of serial data, each digit comprising four serial bits. Thus, an entire data word comprises forty (eg, 10×4) bits. At digit time DT0, the data words are stored in the registers A–D and M as shown in FIG. 5a. That is, the least significant digit, $D_0$, is stored in that portion of the A–D and M registers ready for insertion into A input control 49 or B input control 48 or for recirculation via input logics 50B–50D and 50M, as required. The most significant digit position, $D_9$, stores a hexadecimal code indicating decimal point position. The next most significant digit positiion, $D_8$, holds the overflow digit for carries outside the normal eight digit field. Digit positions $D_7$–$D_0$ holds eight digits of binary coded decimal data.

In FIG. 5b there is shown the mask codes which may be incorporated in the arithmetic instruction words implemented in ROM 30; the set of instruction words using mask codes are described in Section C, Table I. The masks, which are generated by instruction decoder logic 34, indicate to B input control 48 either (1) which digits of the ten digit data word are to be passed from register B for addition to or subtraction from the corresponding digits of the contents of the A register in arithmetic unit 40 or (2) which digits of the contents of register A are to be added to the output of serializer 47 during a constant addition. As can be seen from FIG. 5b, there are five masks, having codes 000–011 and 111 which are listed and are associated with a rectangle beneath the representation of a ten digit data word. The digits enclosed by the rectangle associated with a particular mask are permitted by the mask decoder logic in instruction word logic 34 to pass to arithmetic unit 40 during an arithmetic operation. As will be seen with respect to detailed discussion to the mask logic, the mask codes cause B input control 48 to operate in timed relation with the data passing from the A register into the arithmetic unit via A input control 49. As can be seen from FIG. 5b, there are three possible mask codes which are not defined thereat, namely 100, 101 and 110. Mask 110 actually produces a least significant digit (LSD) mask but may only be used with a key latch to register A operation (See Section G, Table I). Mask 101 and 110 produce no mask at all by B input control 48 but are reserved for decoding the family of flag operation instructions and register operation instructions, respectively.

THE DISPLAY

Referring now to FIGS. 7a and 7b, there is dramatically shown in FIG. 7a the 10 decimal digits, 0–9, displayable by a seven segment character display along with an eighth segment used as a decimal point. With respect to FIG. 7b, the character segments are labeled Segments A–G and the decimal point segment is labeled P. For each character position, there is a common cathode 9 provided for the eight segments as is shown in FIG. 7b. The eight segments A–G and P for each character position are respectively connected in common by conductors $S_A$–$S_G$ and $S_P$. The chip 10 uses segment scanning according to the method disclosed by U.S. Pat. No. 4,014,012 wherein the segments are scanned sequentially and the digit cathodes are selectively energized in connection with the scanning of the segment electrodes to form the characters 0–9 and a decimal point. By using the segment scanning method of U.S. Pat. No. 4,014,012, the display drivers generally used heretofore in the prior art are eliminated. Thus, chip 10 may be directly interconnected with display 11 when the display comprises an array of light emitting diodes.

DETAILED DESCRIPTION OF SYSTEM LOGIC DIAGRAMS

The various parts of the system of FIG. 3 will now be described with reference to FIGS. 8–12 and 14–29 which depict, in detail, the logic circuits implemented on chip 10 to form the circuits depicted by the block diagram on FIG. 3. The following discussion, with reference to the aforementioned drawings, will refer the logic signals available at many points on chip 10. It is remembered that a logical zero corresponds to a negative voltage, that is, $V_{DD}$, while a logical one refers to zero voltage, that is, $V_{SS}$. It should be further remembered that the P-channel MOS transistors depicted in the aforementioned figures be conductive when a logical zero, ie, a negative voltage, is applied at their respective gates. When a logic signal is referred to which is unbarred, ie, has no bar across the top of it, the logic signal is to be interpreted as "True" logic; that is, a binary one indicates the presence of the signal ($V_{SS}$) whereas a binary zero indicates a lack of the signal ($V_{DD}$). Logic signal names including a bar across the name thereof are "False" logic; that is a binary zero ($V_{DD}$ voltage) indicates the presence of the signal whereas a binary one ($V_{SS}$ voltage) indicates that the signal is not present. It should be remembered that the numeral 3 in a clocked gate includes that phase $\phi 3$ is used as the precharge whereas a 4 in a clocked gate indicates that phase $\phi 4$ is used as the precharge clock. An S in a gate indicates that the gate is statically operated.

In the following drawings a three or four digit number is used to refer to the logic devices depicted thereon; the first digit of the three digit number and the first two digits of a four digit number are used to denote the particular figure upon which the element is shown and described with reference to. Thus, for such numbered elements, the following discussion may not refer separately to the figure upon which the particular device is shown.

PROGRAM COUNTER

Figure 8A:
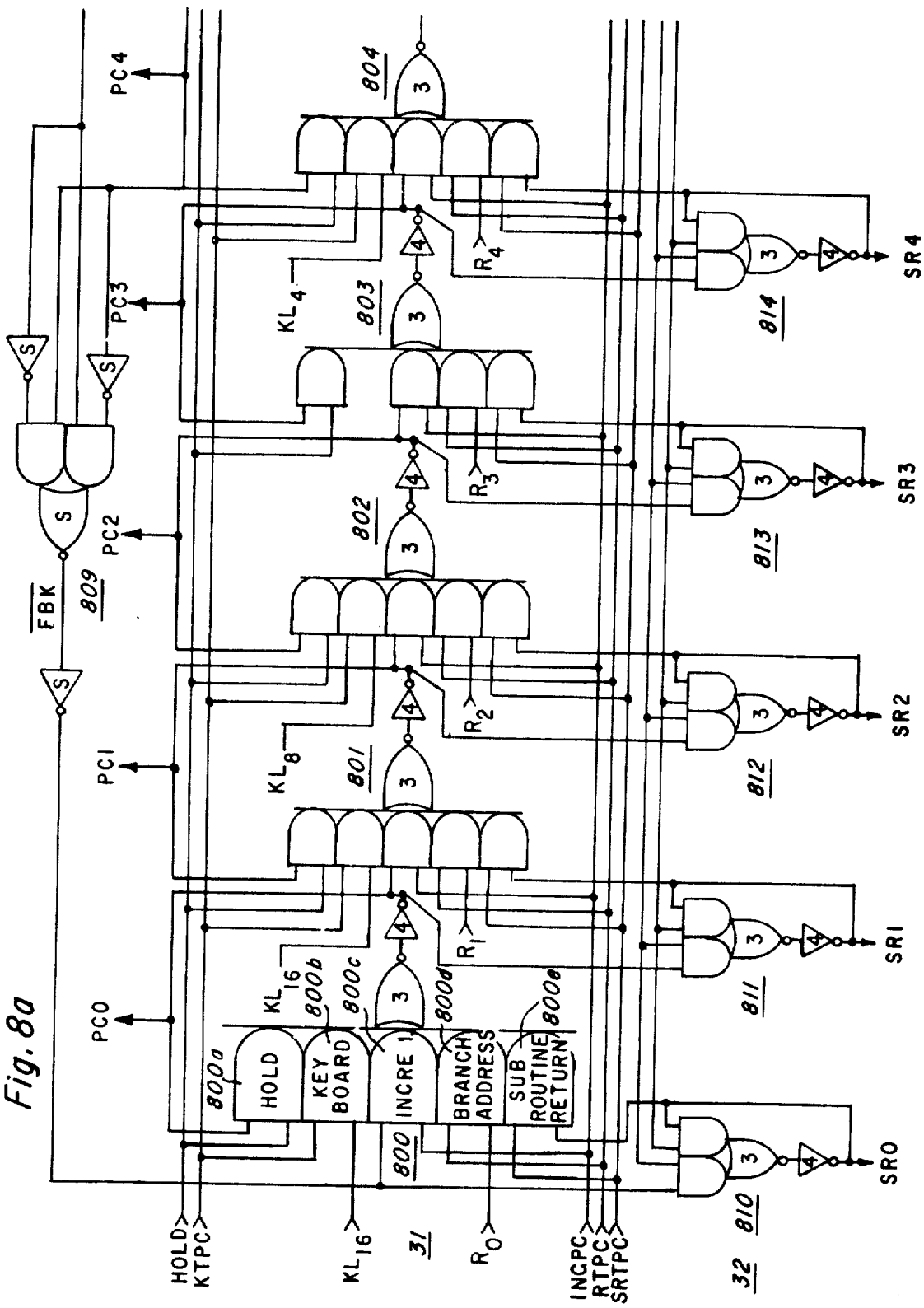
FIGS. 8a and 8b are a logic diagram of the system's program counter.
Figure 8B:
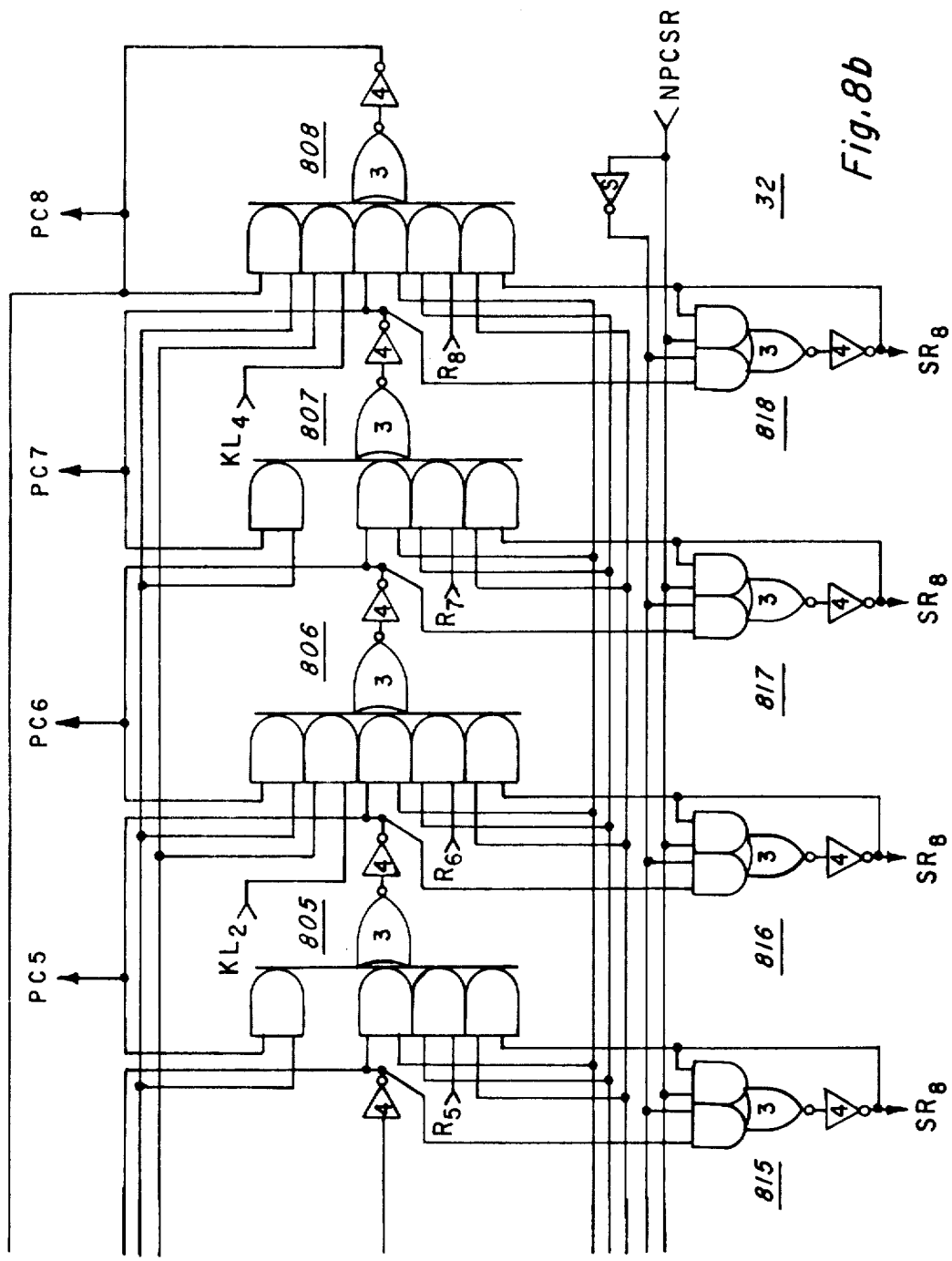

Referring now to FIGS. 8a and 8b, there is shown a logic diagram of program counter 31. Program counter 31 comprises a nine stage shift register comprising stages 800–808, each stage comprises several AND gates (eg, 800a–800e) whose output is connected to a NOR gate with a phase $\phi 3$ precharge. The output of the NOR gate is coupled to an inverter having a $\phi 4$ precharge. One of the AND gates (eg, 800a) is responsive to the output from the inverter and to a "HOLD" control signal. AND gate 800b is responsive to the control signal "KTPC" (Keyboard latch to program counter) and to an output from a keyboard latch, and in this case, KL16. AND gate 800c is responsive to the output from feed back logic 809 and to a control signal INCPC (Increment Program Counter). AND gate 800d is responsive to the output of read-only-memory 30 and to the control signal "RTPC" (ROM To Program Counter) and finally AND gate 800e is responsive to the output from a subroutine register 32 and to a control signal SRTPC (Subroutine To Program Counter). Each of the AND gates in the other stages, 801–808 are identical to that described except that (1) the input to the incrementing AND gate (eg, 801c) is derived from the output from the prior stage and (2) only selected stages receive outputs from the keyboard latch; therefore, the NAND gates equivalent to 800b are not provided for all stages. Feedback logic 809 is responsive to the output from stages 804 and 808 and performs an "inclusive OR" function; thus, whenever the address in the program counter is "incremented," it is done as pseudorandom fashion. Table II lists the instruction words in logical order and thusn shows the pseudorandom count generated by program counter 31. It should be evident to one skilled in the art that program counter 31 which has nine stages, will pseudorandomly count through 511 of the 512 possible states. The HOLD signal is used to retain the address presently in program counter 31 while INCPC pseudorandomly increments the number in the program counter. If no signal is provided on any of the lines HOLD, KTPC, INCPC, RTPC, or SRTPC a zero location is automatically loaded into program counter 31. The outputs from the various stages of the program counter, PC0–PC8, are provided to ROM 30 and to an input of subroutine register 32.

Subroutine register 32 comprises a nine bit address memory, comprising latches 810–818. Each subroutine register latch is responsive to the output from program counter 31 for loading the latch in response to an NPSCR signal and for latching the address stored therein in response to a $\overline{\text{NPSCR}}$ signal.

INSTRUCTION MEMORY

The instruction memory is preferably implemented as a 512 bit read-only-memory (ROM 30). The ROM 30 used in this calculator is not depicted in detail; however, it is responsive to the address (PCO–PC8) supplied by program counter 31 and is preferably of the virtual ground type disclosed in U.S. Pat. No. 3,934,233 by Roger J. Fisher granted Jan. 20, 1976 and assigned to the assignee of this invention. Using the virtual ground ROM of U.S. Pat. No. 3,934,233 permits the size of ROM to be significantly reduced in comparison to the ROM typically used in the prior art by using one ground or $V_{SS}$ line for five or more P diffusions.

ROM 30 may be programmed with the instruction words listed in Table II for implementing an electronic calculator. Table II lists each instruction word and its pseudorandom address.

INSTRUCTION WORD DECODER LOGIC

Referring to FIG. 9 there is shown that part of the decoder logic used to decode RETURN, DONE, CALL AND BRANCH family of instructions. NAND gate 900 is arranged to decode the RETURN instruction while NAND gate 901 is arranged to decode the DONE instruction. NAND gate 902 decodes the CALL instruction while NAND gate 903 decodes BRANCH instructions. Thus NAND gates 900–903 are responsive to the instruction word from ROM 30 and are also responsive to $\overline{\text{BL}}$. $\overline{\text{BL}}$ is a signal provided by the BRANCH latch 20 indicating that the address following a BRANCH instruction is then being outputted from the ROM; thus $\overline{\text{BL}}$ disables NAND gates 900–903 so that they do not decode the BRANCH address. NAND gates 900–903 are responsive to the instruction word outputted from ROM 30, rather than the instruction word in instruction register 33 (which cannot be a branch call, return or done instruction). Thus NAND gates 900–903 provide instruction decoder logic means for decoding the instruction word outputted from the instruction memory or ROM 30.

In FIG. 10 there is shown a series of NAND gates 1000–1008 for decoding which Flag Latch 38 is being addressed by a flag operation. In as much as NAND gates 1000–1008 are responsive to instruction words outputted from the instruction register 33, which is not loaded with either a branch type instruction or a branch address instruction, NAND gates 1000–1008 need not decode either the $I_0$ or $I_1$ bits of an instruction word.

Further NAND gates 1000–1004 and 1007 are not responsive to the $I_5$ bit indicating a set or reset function, in as much as flag latches 2200–2205 are responsive to the $I_5$ bit.

The instruction decoder logic 34 includes a mask generator for controlling the digits inputted to the arithmetic unit 40 by B input control 48, as aforementioned. Gates 1100–1104 decode the least significant digit (LSD), most significant digit (MSD), overflow (OVF), decimal point (DPT), and mantissa (MANT), masks in arithmetic instruction words outputted from instruction register 33. The various arithmetic instruction are defined in Section C of Table I and the various masks are defined in FIG. 5b. AND gate 1100 is responsive not only to bits of the instruction word forming a LSD mask but also the output of an OR gate 1105. OR gate 1105 is responsive to the $I_5$–$I_8$ bits of the instruction word for invalidating the LSD mask when a NO-OP instruction is encountered. A NO-OP instruction is defined as an arithmetic operation where the constant zero is added to the A register in Section C of Table I; however, that addition is not accomplished, the data words merely recirculate. The LSD mask is invalidated at this time so that the addition is not made. Of course, making the addition would not change the number in the A register; however, making the addition could change what ever had been previously loaded into the Carry Latch 37 as result of a prior arithmetic operation. Therefore, in order for a NO-OP to be a true NO-Operation instruction, the Carry Latch 37 must not be altered. Consequently, the LSD mask is not generated for this particular instruction and hence the reason for decoding the $I_5$–$I_6$ bits in OR gate 1105. The outputs of NAND gates 1100–1104 are provided to a NOR gate 1106 whose output is provided via $\beta_0$ and $\beta_3$ controlled transfer gates. The outputs of the $\beta_3$ controlled transfer gate is provided to three inverters 1107–1109 for providing the $\overline{\text{MASK 34}}$, $\overline{\text{MASK 03}}$, MASK 34, MASK 03, and $\overline{\text{MASK 04}}$ signals. The first number indicating the bit time and the second number indicating the precharge time of the particular mask signal. AND gates 1100–1104 are responsive to DT0E, DT7E, DT8E, DT9E and $\overline{\text{DT9E}}$ respectively for generating the appropriate mask in the appropriate digit times, according to the mask scheme shown in FIG. 5b.

Figure 12:
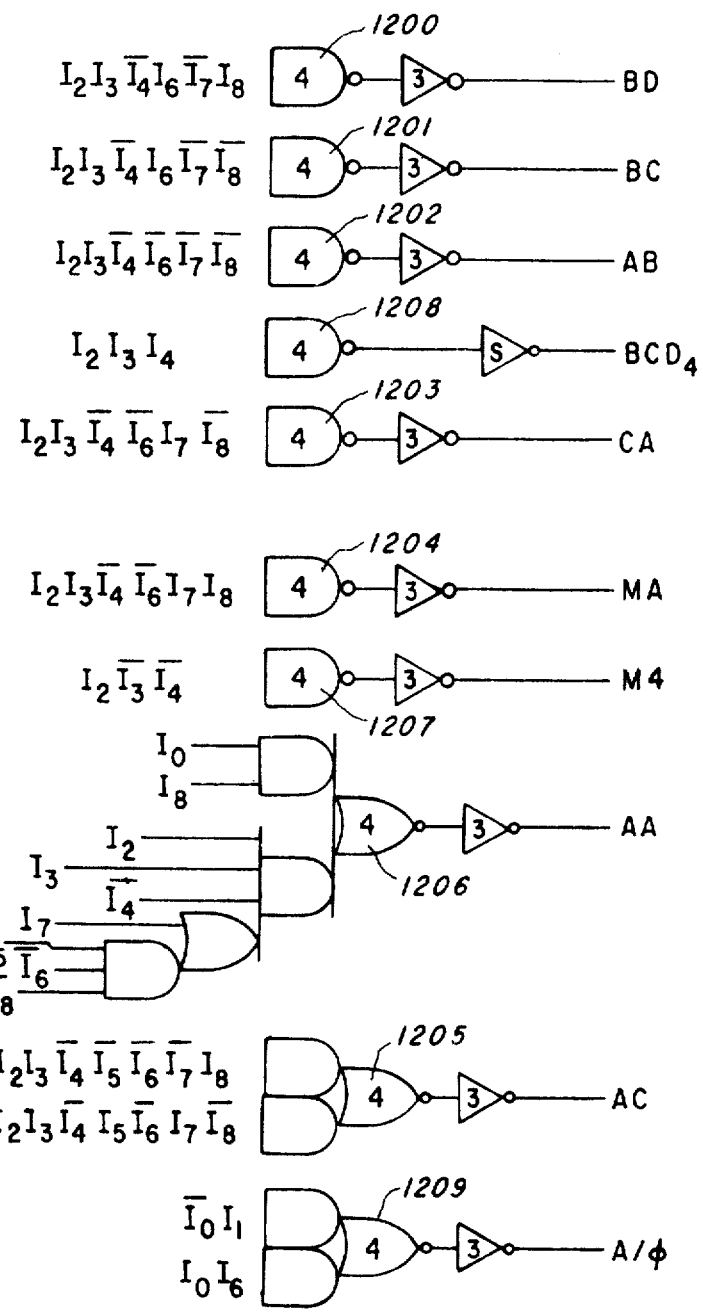
FIG. 12 is a logic diagram of that portion of the instruction word decoder logic used for decoding most register operation instructions and some arithmetic instructions.

In FIG. 12, there is shown that portion of instruction word decoder logic 34 used for decoding most of the register operation instructions (Section E, Table I) and some of the arithmetic instructions (Section C, Table I). NAND gates 1200–1204 decode the instruction word in instruction register 33 for producing signals BD, BC, AB, CA and MA, respectively. Signal BD indicates either a Register B to Register D (B→D) transfer instruction or a Register B-Register D (B/D) exchange instruction has been decoded. The same convention applies to signals BC, AB, CA and MA. As will be seen, the $I_5$ bit indicating whether it is an exchange or transfer operation is decoded locally at the input logics 50B and 50M to register B and D and at the input to arithmetic unit 40 at A input control 49. Complex gate 1205 generates signal AC by decoding either an A→C transfer instruction or an C/A exchange instruction, but not an C→A transfer instruction.

Complex gate 1209 decodes the A/$\phi$ bit in the two types of arithmetic instruction (A±B or A+K). Complex gate 1206 decodes the $\overline{\text{AA}}$ signal. When $\overline{\text{AA}}$ is a logical one, the output of the Register A is not passed through A input control 49, which is done during (1)

shift operations or (2) register operations involving the A transfer other than A→B and A→C transfer instructions. For all other conditions, the output of Register A is applied to A input control 49 and thus the normal data recirculation path for Register A is via A input control 49 to arithmetic unit 40 and back into the A register via input logic 50A. Of course, when the contents of Register A are merely recirculating, no data is passed by B input control 48, because of the absence of a mask signal.

NAND gate 1207 decodes the key latch to register A instruction (See Section G, Table I) producing an M4 signal in response thereto. NAND gate 1208 decodes MANT mask during arithmetic operations involving the A and B register for producing an BCD signal which signals the arithmetic unit 40 to perform automatic binary coded decimal correction. As wil be seen, for other operating conditions, the arithmetic unit automatically operates in hexadecimal.

The foregoing discussion of the instruction word decoder logic 34 has accounted for most of the decoding of the instruction words listed in Table I. As been previously noted, selected bits of some instruction words have not been decoded in the instruction word decoder logic 34 but decoded locally. The decoding of these particular portions of instruction words will be discussed with reference to the elements which decode those instruction word bits.

As can be seen, the portions of instruction word decoder logic used to control the flag logic (FIG. 10), the mask generator (FIG. 11) and register operations (FIG. 12), are responsive to the instruction word in instruction register 33 and thus these decoders need not decode branch, branch address, call, return or done instructions which are not loaded into instruction register 33. The NO-OP instruction which is then loaded into instruction register 33 merely permits the data in the registers A-D and M to recirculate. Thus, the foregoing decoders provide the instruction word decoder logic means for decoding the instruction word outputted from the instruction register 33.

DATA REGISTERS, REGISTER INPUT LOGIC AND ARITHMETIC UNIT INPUT CONTROL

Figure 13:
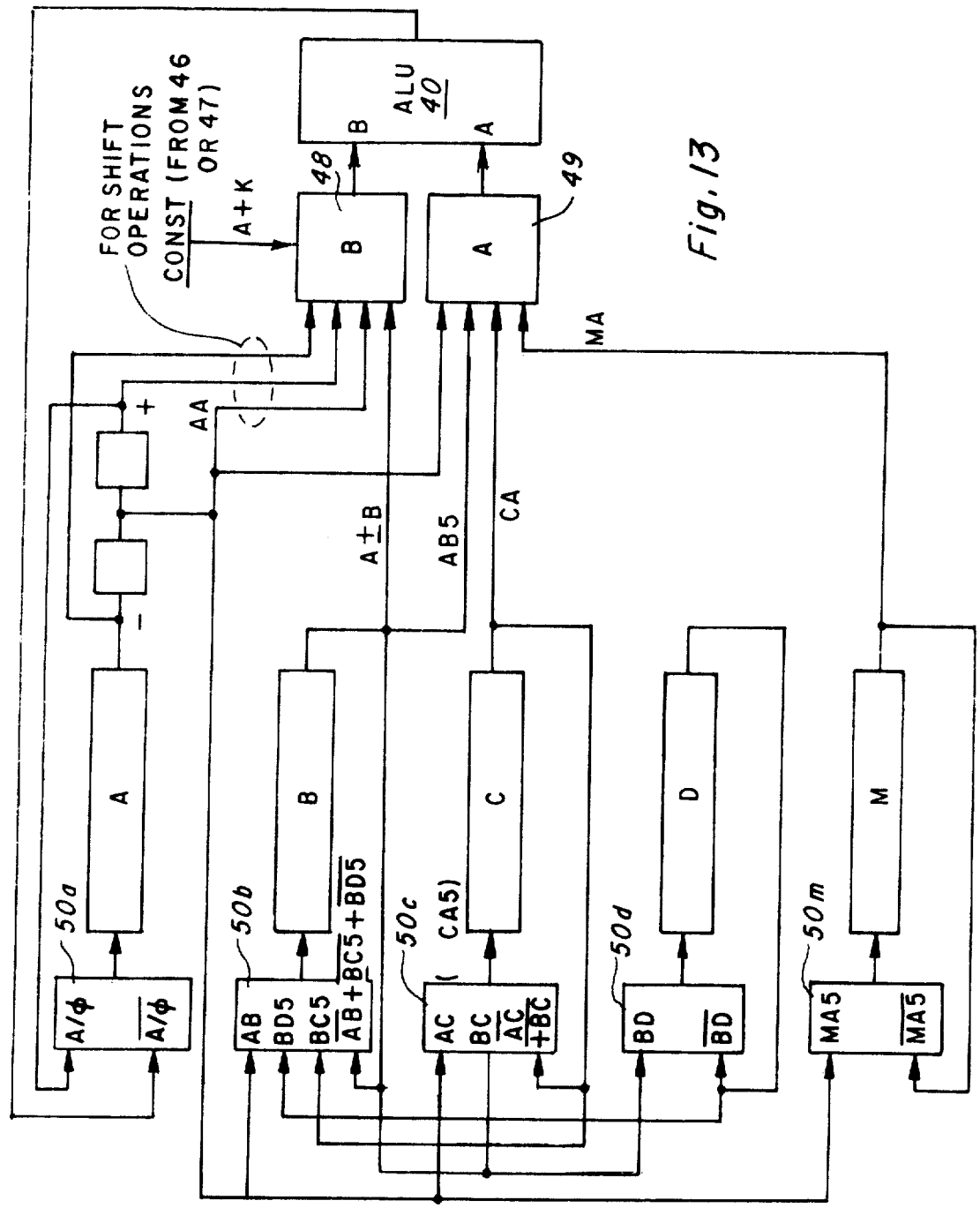
FIG. 13 is a detailed block diagram of registers A–D and M, register input control logics, arithmetic unit, and arithmetic unit input controls.

In FIG. 13 there is shown a more detailed block diagram of registers A-D and M, their input logics 50A-50D and 50M, arithmetic unit 40 and A and B input controls 49 and 48. Within A and B input control 49 and 48 and the register control logics 50A-50D and 50M, are indications of which of the data control signals are decoded for enabling the data transfer paths shown. The format for the signal names shown in FIG. 13 agrees with the control signals decoded by the decoders on FIG. 12 except that if the $I_5$ bit being decoded indicates an exchange instruction (eg, B/D) rather than a transfer instruction (eg, B→D), the numeral 5 has been added after the control signal name (eg, BD5). The only control signals shown in FIG. 13 which have not been heretofore mentioned are the A±B and A+K control signals which will be discussed with reference to FIG. 17.

Figure 14:
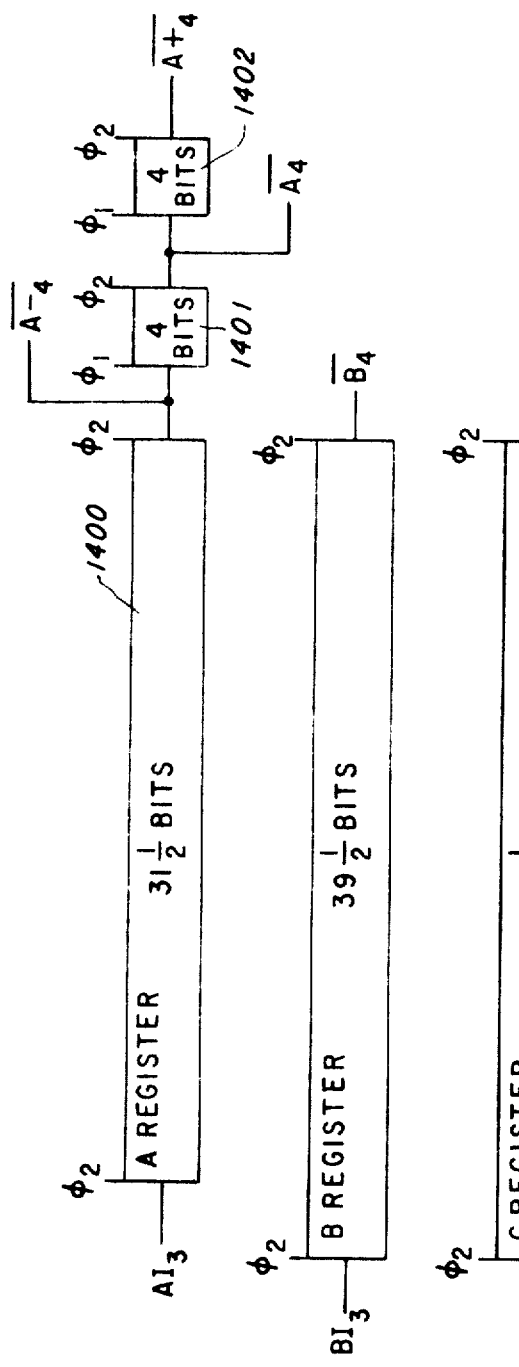
FIG. 14 is a logic diagram of the registers used to implement the calculator's data memory.
Figure 15:
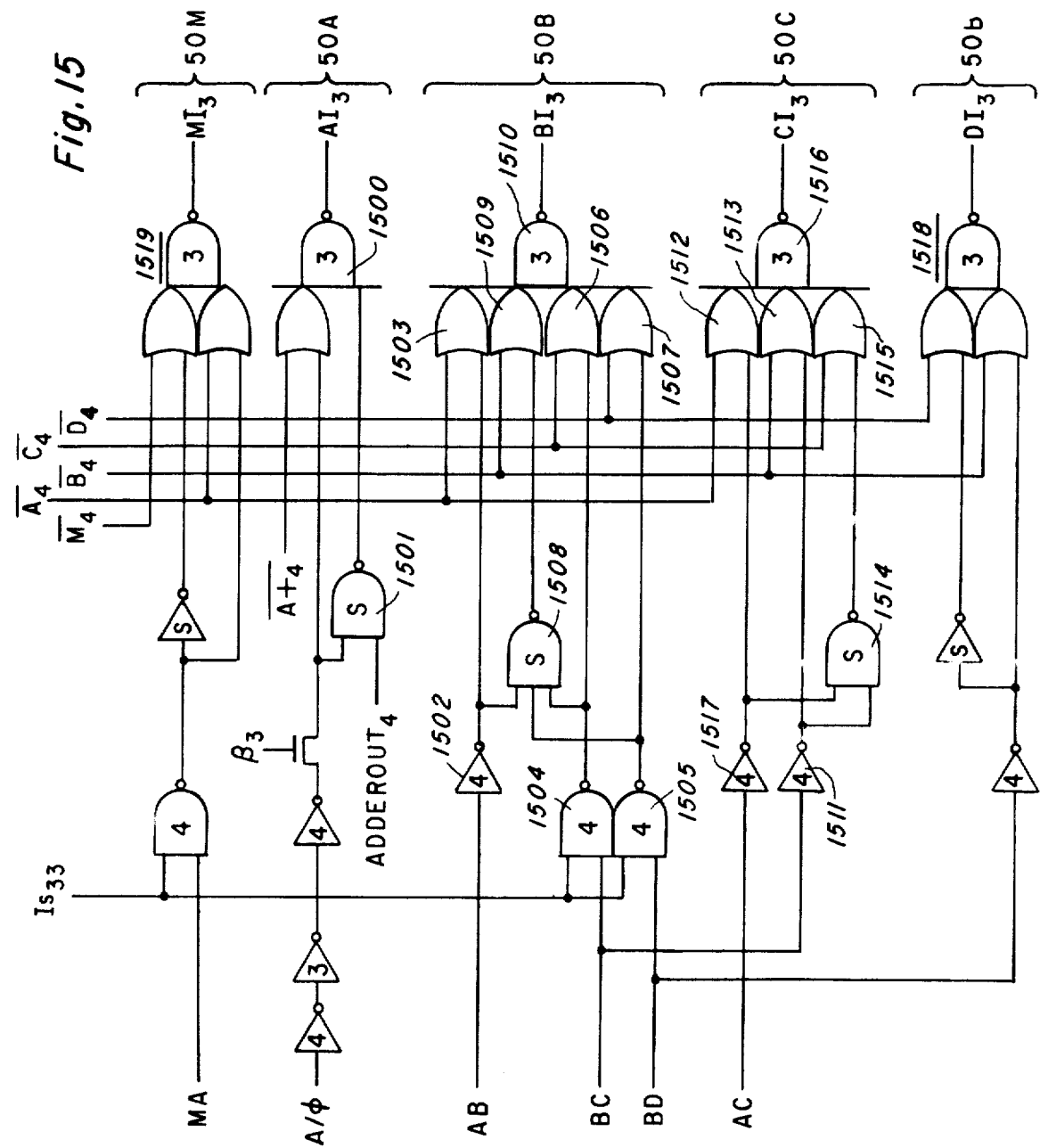
FIG. 15 is a logic diagram of the register input logics.

The calculator's data memory is provided by registers A-D and M which are shown in FIG. 14. Registers B-D and M each comprise 39½ bits of storage for storing a data word having ten decimal places. Inasmuch as 39½ bit are provided, in lieu of 40 bits, the outputs thereof are inverting compared to the inputs thereof. The major portion of the A register, 1400, comprises 31½ bits of storage. The output of shift register 1400 $\bar{A}-$, is connected to a four bit shift register 1401. The output of shift register 1401, $A_4$, is provided to another four bit shift register, 1402, whose output is $\bar{A}+$. The normal data path from the A register is from the output of the shift register 1401 for data recirculation, arithmetic operations, and data transfer exchange operations. The A− and A+ outputs are used for shift operations. Additionally the A+ output is used as a recirculation path for the A register when the output from arithmetic unit 40 is open-circuited when the A/φ bit in the arithmetic instruction words (See Section C, Table I) is a binary one.

As can be seen from register input logic 50A, gates 1500 and 1501 are arranged to normally communicate the output from arithmetic unit 40 (ADDEROUT) into Register A, and to output the $\bar{A}+$ output of the A register into the input of the A register when A/φ from complex gate 1209 is a logical one. Register input logic 50B is responsive to signal AB inverted by inverter 1502 at OR gate 1503 for transferring the contents of register A to the input of register B. It is further responsive to signals BC and BD and the $I_5$ bit of the instruction word at NAND gate 1504 and 1505 whose outputs are connected to OR gate 1506 and 1507 for inserting the output from the C and D registers respectively in response to a B/C or B/D register exchange operations. Further, the outputs from inverter 1502 and NAND gates 1504 and 1505 are provided as inputs to a NAND gate 1508 whose output is connected to OR gate 1509 which is also responsive to the output of register B. Thus, NAND gate 1508 and OR gate 1509 permit contents of the B register to recirculate when none of the other exchange or transfer operations (A/B, A→B, B/C or B/D) is indicated. The outputs of OR gates 1503, 1509, 1506 and 1507 are supplied to a NAND gate 1510 whose output is provided as an input to register B.

Register input logic 50C includes inverters 1517 and 1511 for inverting the BC and AC signals which are then provided to OR gates 1512 and 1513, which are also responsive to the output from registers A and B respectively. The outputs from inverters 1517 and 1511 are also provided to a NAND gate 1514 for providing the recirculation function as did NAND gate 1508 in register input logic 50B. The output of NAND gate 1514 is supplied to an OR gate 1515 along with the output of register C. The outputs of OR gates 1512, 1513, and 1515 are connected as inputs to NAND gate 1516 whose output is connected to the input of register C.

Register input logic 50D is responsive to the BD signal for inputting the contents of the B register or recirculating the contents of the D register as indicated by complex gate 1518.

Register input logic 50M is responsive to the MA signal and the $I_5$ bit for inserting the contents of the A register into the M register when an M/A exchange operation has been decoded and for recirculating the contents of the M register when the exchange operation is not indicated at complex gate 1519.

Figure 16:
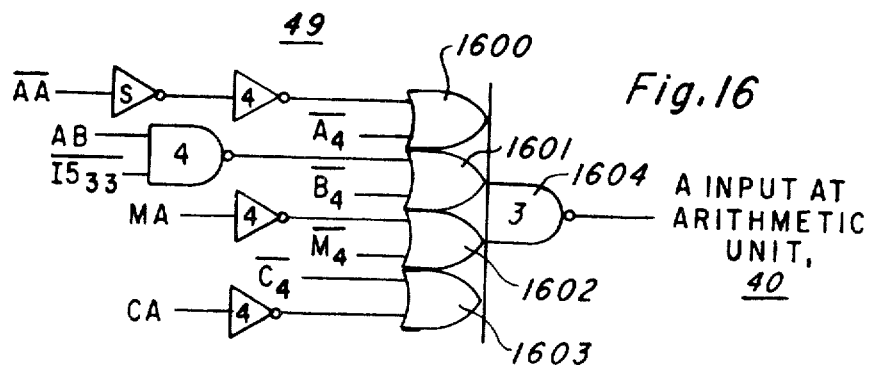
FIG. 16 is a logic diagram of the input control for the A input to the arithmetic unit.

The input control for the A input to the Arithmetic unit 40, that being A input control 49, is shown in FIG. 16. A input control includes four OR gates 1600-1603 whose outputs are connected to a NAND gate 1604 whose output is in turn connected to the A input of arithmetic unit 40. The normal data path is through OR gate 1600 for inputting the contents of Register A into arithmetic unit 40 in response to an AA signal from complex gate 1206. OR gates 1601-1603 are enabled inputting the contents of the B, C and M registers into arithmetic unit 40 on an A/B exchange operation and decoding of CA and MA signals respectively.

Figure 17:
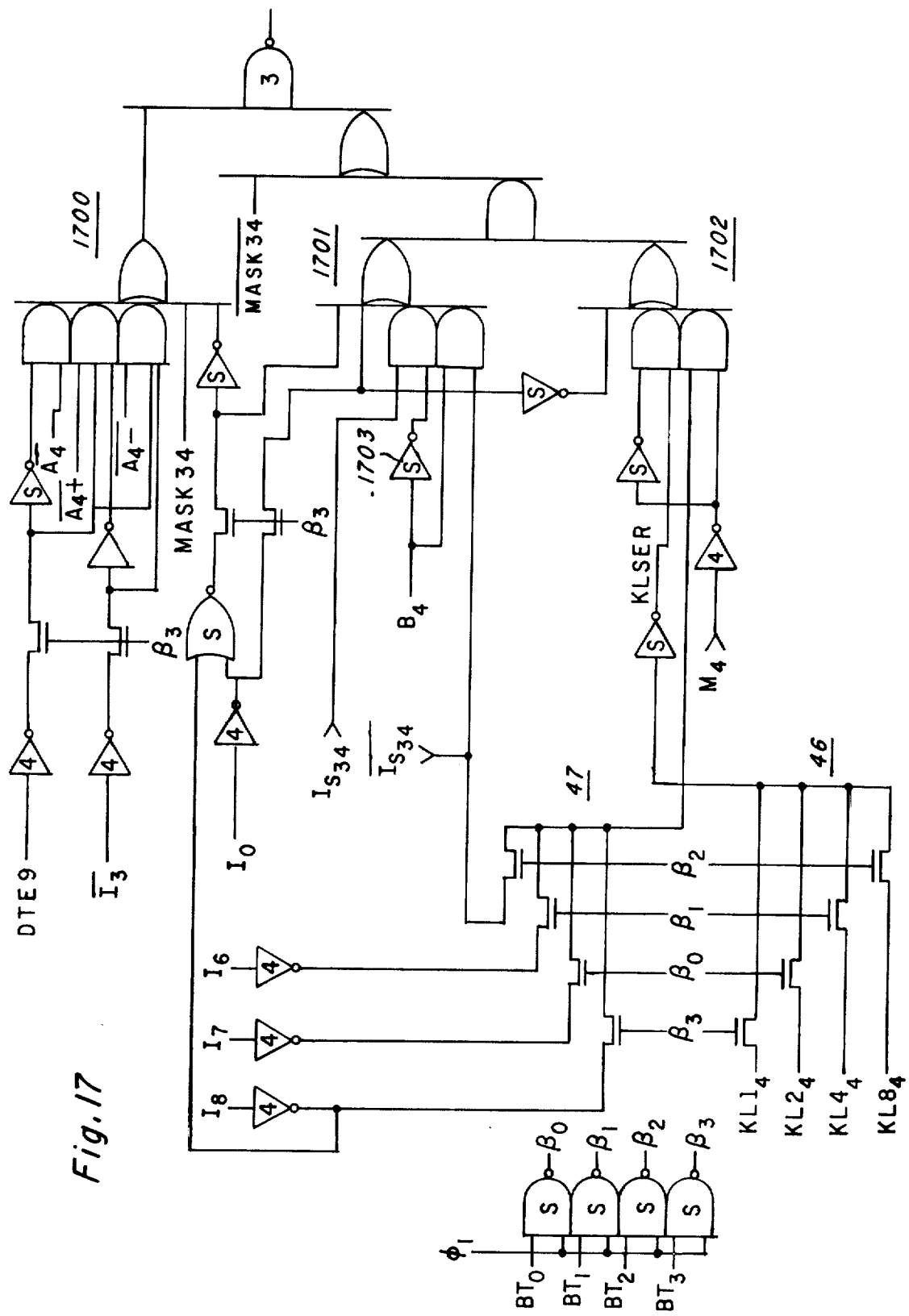
FIG. 17 is a logic diagram of the input control for the B input to the arithmetic unit.

B input control 48 is shown in FIG. 17. Gates 1700 interconnect the A, A+, and A− outputs of the A register to the B input of arithmetic unit 40 during left and right shift operations. $I_3$ from the instruction register 33 is decoded for indicating whether a shift operation is to be a right or left shift. As can be seen, gates 1700 are hardwired perform shift operations under a MANT mask. That is the decimal point digit which is received at DT9E is provided automatically from the A output while the A+ output is used for a left shift and the A− output is used for a right shift. Gates 1700 are also responsive to the MASK 34 signal. As can be seen from Section D of Table I and FIG. 6e, the $I_3$ bit controlling the detection of the shift also generates a LSD mask during a left shift operation while a right shift signal also generates an OVF mask. However, instead of using the MASK 34 signal to indicate what digits are permitted to go to the arithmetic unit, the MASK 34 is used at gate 1700 to indicate which digits are not permitted to go to the adder, that is, the first digit (LSD MASK) is not permitted to to to the adder during a left shift operation thereby automatically zeroing that digit. Similarly, the most significant digit is zeroed during a right shift by this use of the MASK logic.

Gates 1701 are provided for inputting the contents of register B into the B input of the adder if an arithmetic operation not involving a constant is indicated by the instruction word outputted from ROM 30. Thus, gates 1701 decode A±B type arithmetic operations. Inverter 1703 is used to first invert the B output from Register B during subtraction operations when the $I_5$ bit is a logical one.

Gates 1702 are used during an arithmetic operation involving a constant for loading a serialized constant from the $I_6$–$I_8$ bits of the instruction word via serializer 47 when M4 is a logical zero or for loading a constant from the keyboard latches via a serializer 46. Thus, gates 1702 decode A+K type arithmetic operations.

ARITHMETIC UNIT

Figure 18:
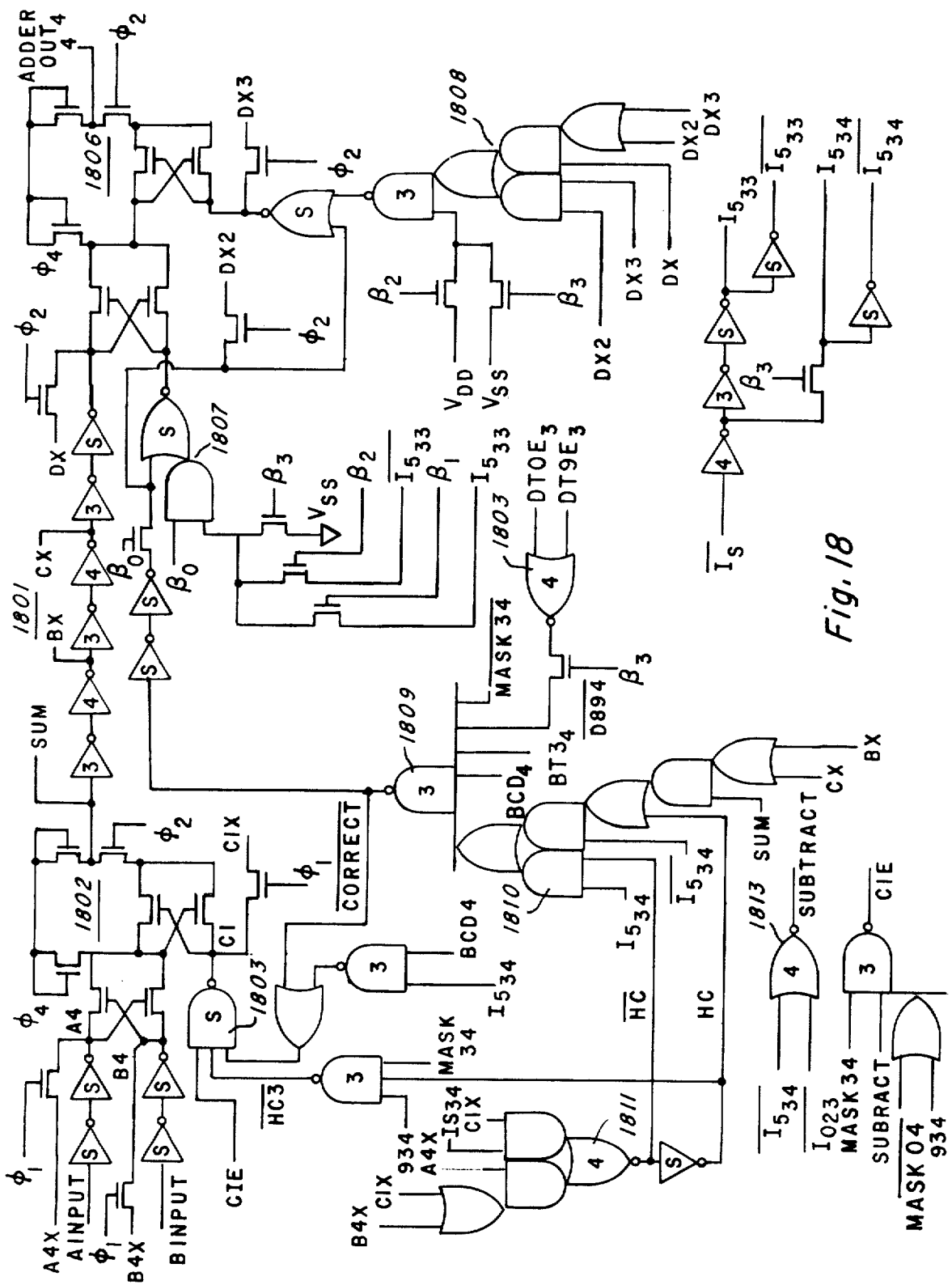
FIG. 18 is a logic diagram of the arithemtic unit.

Arithmetic unit 40 is depicted in FIG. 18. Arithmetic unit 40 is a serial arithmetic unit with inputs labeled A and B and has 3½ bits of delay associated therewith. Gates 1802 and 1806 are ratioless full adders of the type disclosed in U.S. patent application Ser. No. 757,791, filed Dec. 27, 1976 using cross coupled MOS type exclusive OR gates arranged in series. Gates 1802 produce a sum output with three inputs (ie, A, B and CARRY) in half a bit of delay. The CARRY bit can come from one or three sources which are provided to gate 1803. One of the sources is CIE generated at gate 1812 which is used to insert a CARRY at the beginning of a MASK when a subtract operation is being done. A CARRY bit is needed at that time according to the twos complement subtraction accomplished in arithmetic unit 40. Gate 1812 has a MASK 34 and a MASK 04 signals which are delayed different amounts by the MASK generator (FIG. 11) and thus NAND gate 1812 is effectively a leading edge detector. Timing signal 934 which goes to gate 1812 is used to block out a CARRY signal over to the next instruction cycle. Gate 1813 is responsive to the $I_5$ and $I_0$ bits and is used to generate a SUBTRACT signal during A−B operations. A second method for producing the CARRY is the hex carry (HC) that is generated by gates 1811 which has its inputs the previous CARRY delayed one bit and the A and B adder inputs. The CARRY generated by gate 1811 is also blocked at 934 by gates 1800 at the very end of instruction cycle to prevent it from carrying into the beginning of a next instruction cycle. The last method of creating a CARRY is with binary coded decimal (BCD) correction. If the result has to be BCD corrected, and it's an addition operation, then a CARRY is forced during a BCD correction during a substraction operation. Gates 1810 determine whether or not a BCD correction is required by sampling each digit outputted from adder 1802. This is done by sampling the outputs CX, BX and SUM outputted from the shift register 1801 connected at the output of adder 1802. SUM, CX and BX determine whether or not the outputted result is greater than a decomal nine. The $I_5$ bit of the instruction word also goes into gates 1810 to determine whether or not the correction should be done for a subtract or an add. If an addition operation is indicated the condition for correction, CORRECT, is either a hex carry (HC) or a sum greater than nine. If a subtraction operation is indicated, in which case $I_5$ is a binary one, the condition for generating a CARRY is lack of a hex carry (HC). Gate 1809, which generates CORRECT, is responsive to the output from gate 1810, the BCD signal from gate 1208, mask signals and timing signals for determining whether or not a correcting signal should be sent out. Gate 1803 provides a timing signal which inhibits BCD correction during the overflow and decimal point digits which are always operated on in hexadecimal.

Gate 1807 provides the input for the plus six or 10 correction factor when the BCD correction is made in the second adder 1806. If an addition operation is indicated ($I_5$ being a binary zero), then a six is added. However, if $I_5$ is a binary one then a subtraction operation is indicated and a plus ten is added in adder 1806. Adder 1806 is responsive to the output of the shift register 1801, to the plus six or plus ten generated at gates 1807 and the previous carry which is generated by gates 1808.

INSTRUCTION REGISTER CONTROL AND BRANCH LOGIC

Figure 19:
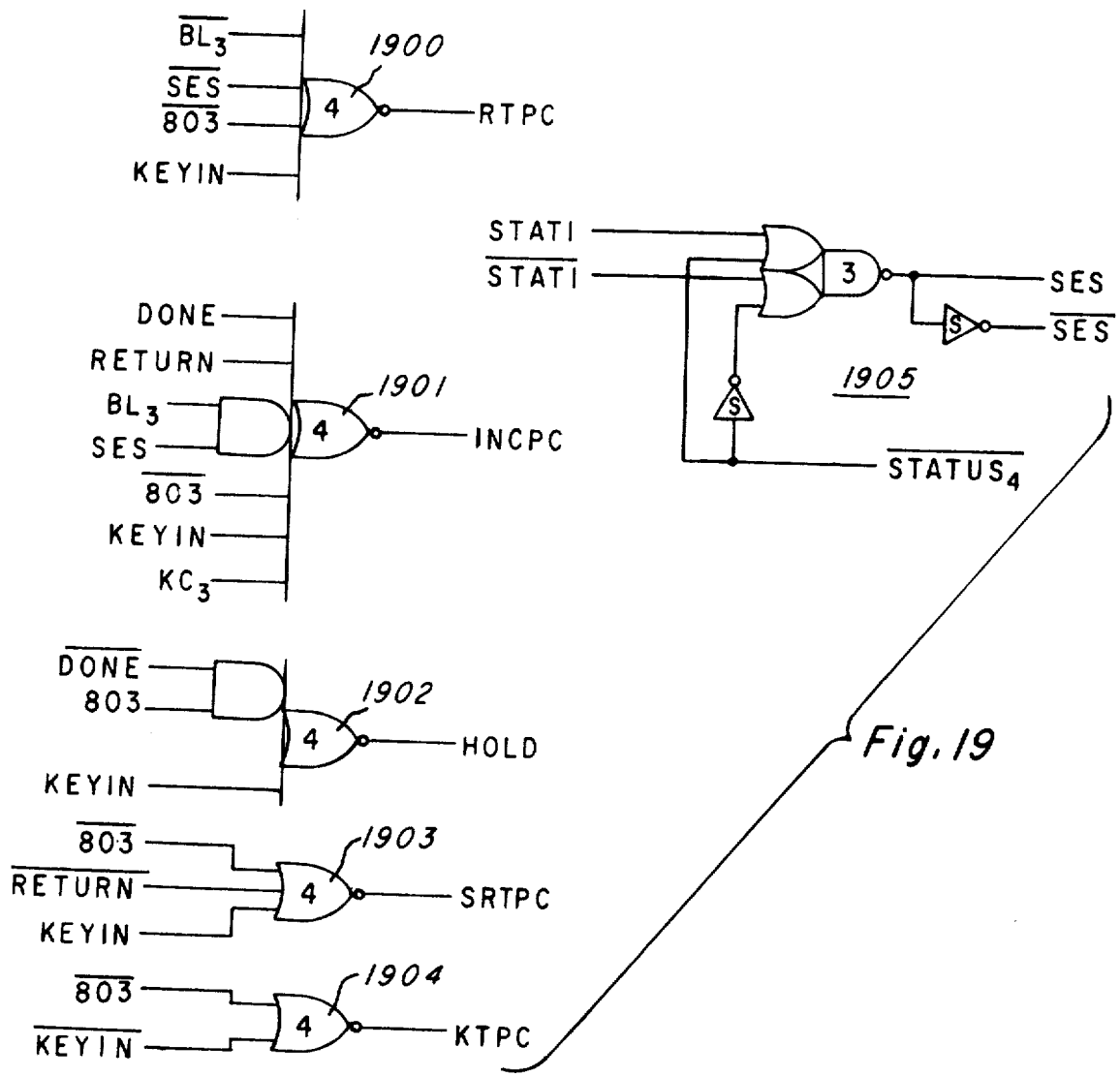
FIG. 19 is a logic diagram of the instruction register control which generates control signals for the program counter.
Figure 20:
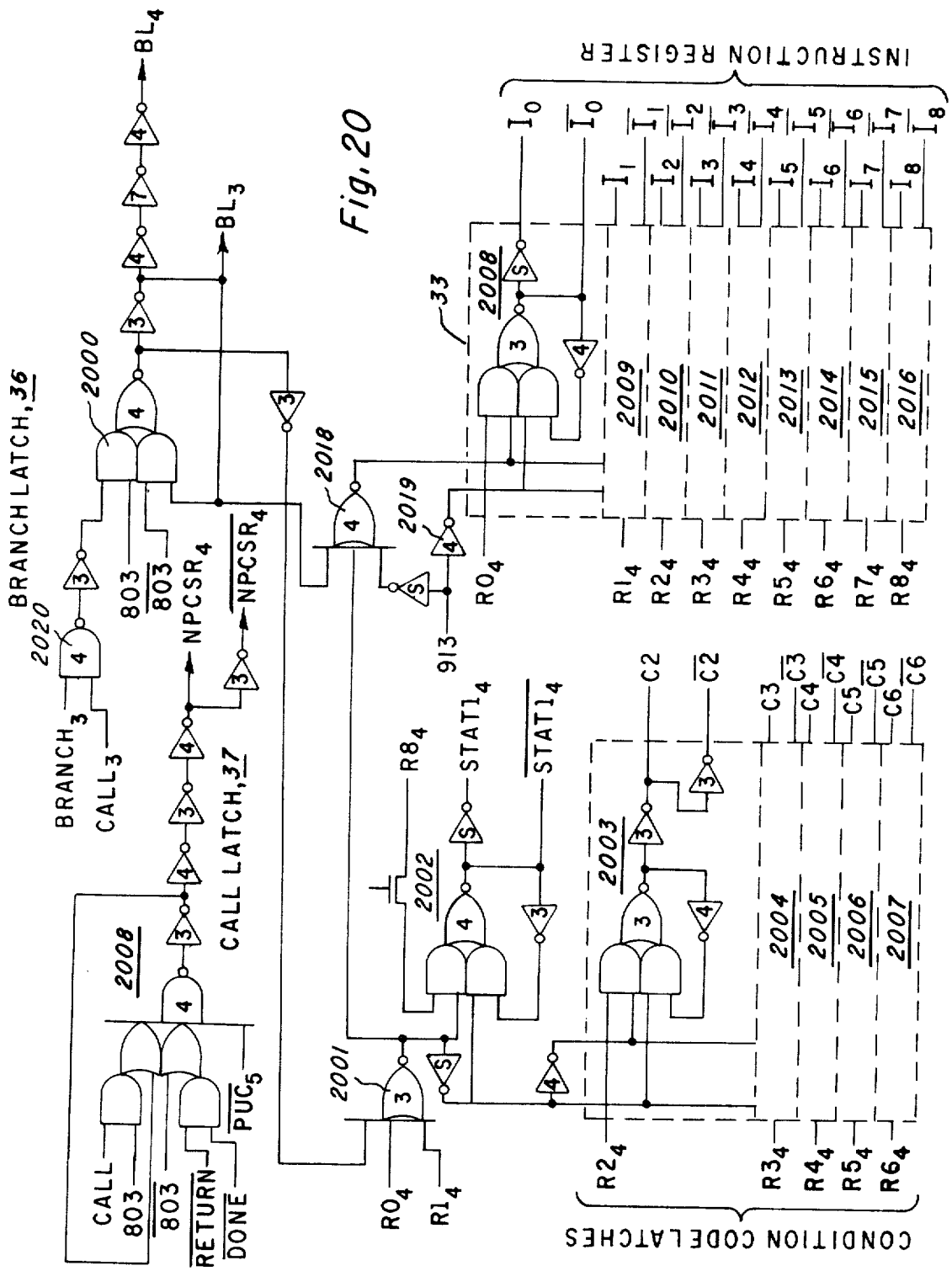
FIG. 20 is a logic diagram of a portion of the calculator's branch logic, the condition code latches, the branch latch, the call latch and the instruction register.
Figure 21:
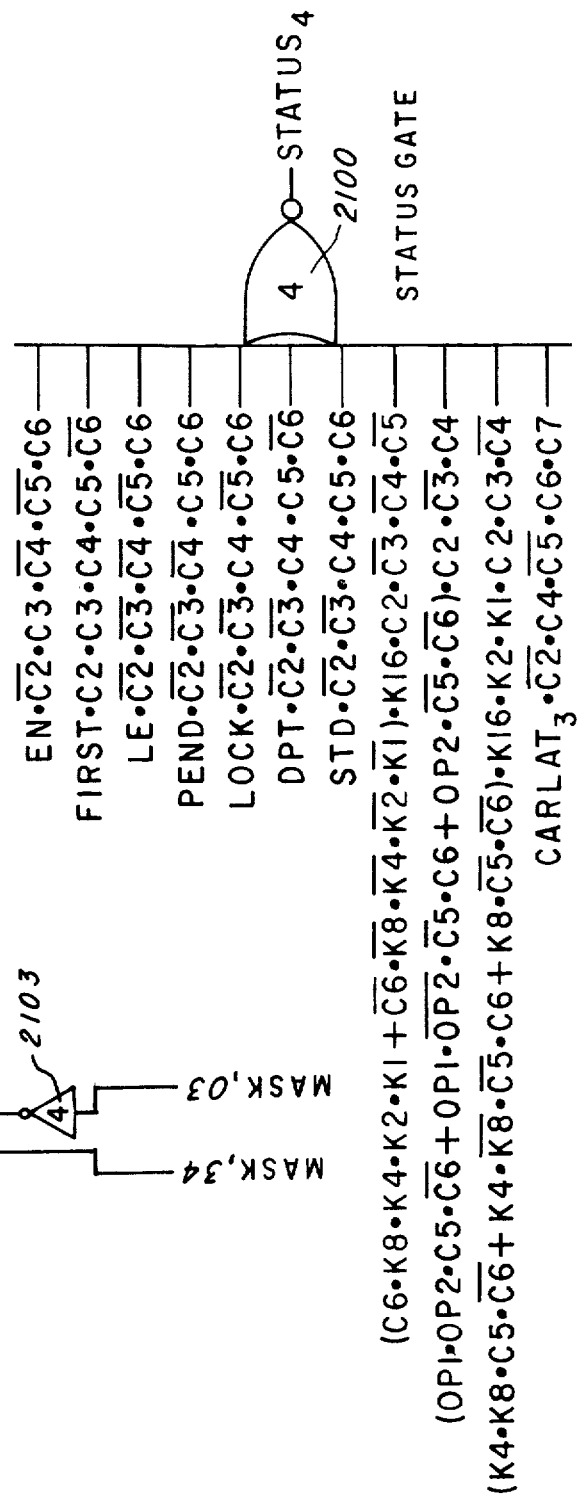
FIG. 21 is a logic diagram of the carry latch and a portion of the calculator's branch logic.
Figure 26:
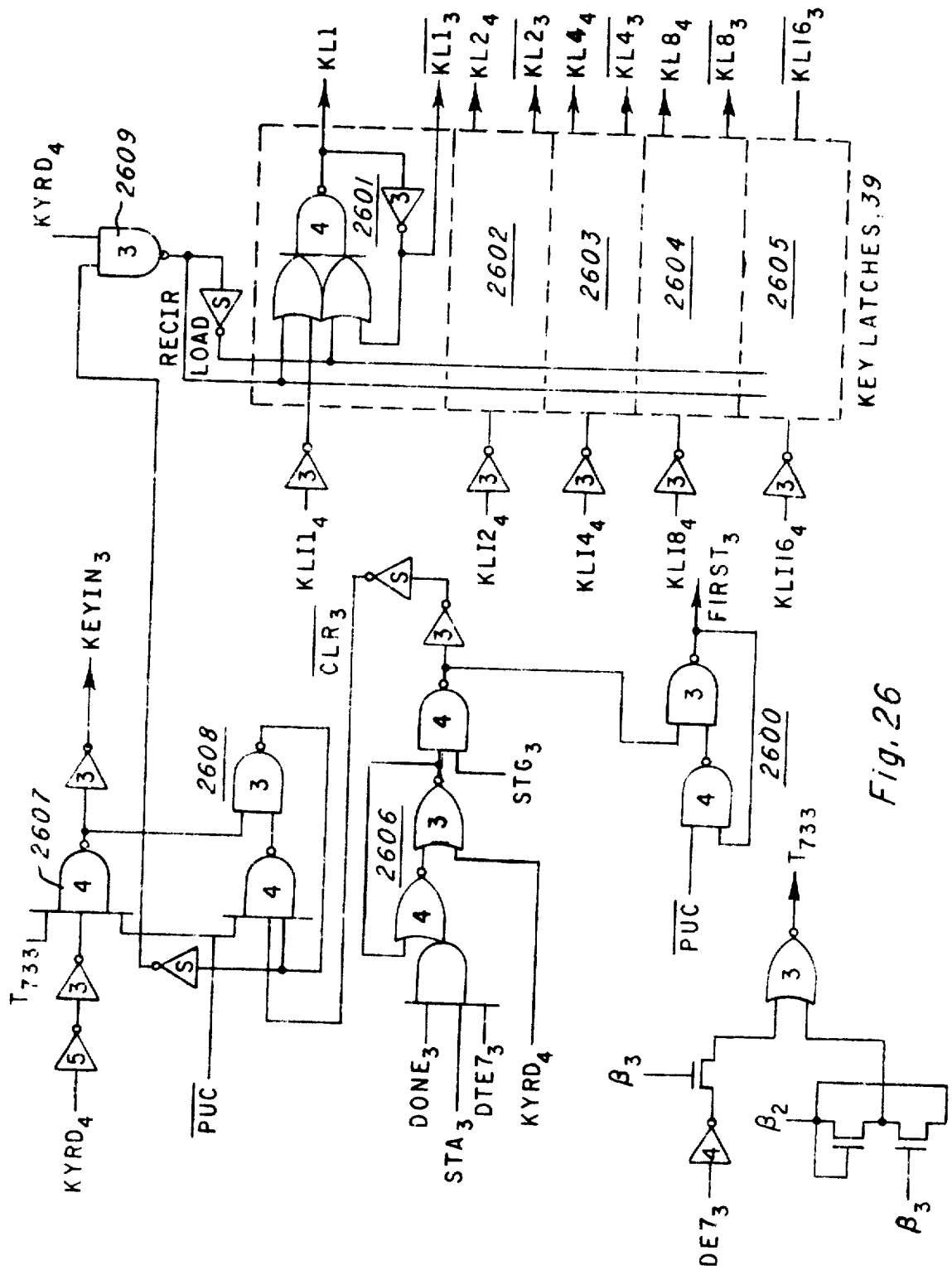
FIG. 26 is a logic diagram of the key latches and debounce logic.

Instruction register control and branch logic is depicted in FIGS. 19, 20 and 21. Branch latch 36, which is formed by gates 2000, is responsive to a decoder branch or call instruction received at NOR gate 2020 for setting the latch for one instruction cycle. The outputs from branch latch 36, BL and BL, indicate that the next instruction word outputted from ROM 30 is an address word and it is to be decoded as an address and not as an instruction.

Signals RTPC, INCPC, HOLD, SRTPC, and KTPC, which are utilized in the control of program counter 31, and previously discussed with reference to FIGS. 8A and 8B, are generated by gates 1900-1904, respectively. Considering for the moment a branch instruction, which will result in generating the RTPC signal if either (1) the indicated condition is satisfied or (2) it is an unconditional branch, gate 2001 decodes the family of branch instructions (including call, return and done instructions—the $R_0$ and $R_1$ bits of the instruction word both being a logical one). Gate 2001 permits a set of condition code latches 2002-2007 to be loaded with the $R_8$ and $R_2$–$R_6$ bits of the instruction word when a branch operation is indicated. Latch 2002 is loaded with the status bit $R_8$, while latches 2003-2007 are loaded with the five bits indicating which condition is to be tested or indicating that the branch is to be made unconditionally (See Section A, Table I). The five bit condition code (COND) loaded into latches 2003-2007 is used to determine which of the possible flags or latches according to Section A of Table I are to be compared with the status bit loaded into latch 2002, for instance. Complex gate 2100 decodes flag 38 or latch 37, 39 or 2600 or (2) no flag or latch if an unconditional branch or call is indicated, to status comparison gate 1905. At gate 1905, which functions as an exclusive or, the contents of the status bit in latch 2002 is compared with the output from complex gate 2100, generating the signal SES, which is a logical one if either an unconditional branch or call has been decoded or a conditional branch has been decoded and the state of the status bit $R_8$ matches the state of the indicated latch or flag. Thus, RTPC is generated by gate 1900 when both SES and BL indicate the aforementioned conditions have occurred. Conversely, gate 1901 will generate INCPR when the aforementioned conditions have not occurred and no RETURN or DONE instruction is decoded.

FLAGS AND LATCHES

Carry latch 37 is implemented by gates 2101 which are responsive to hex-carry (HC) from arithmetic unit 40 and to the output of NOR gate 2102. NOR gate 2102 is respnsive to mask signals MASK 34 and MASK 03, often being inverted by inverter 2103. NOR gate 2103 is arranged as a trailing edge detector circuit, so that carry latch 37 is set whenever a hex-carry is indicated outside the mask during an arithmetic operation.

The live entry (LE), pending (PEND), store (STO), overflow (LOCK), decimal point (DPT), an entry (EN), flags are stored in latches 2200-2205. These flag latches 38 are responsive to the $I_5$ bit for either setting or resetting the latch and the flag latch enabling signals generated by gates 1000, 1001, 1004, 1002, 1003, and 1007, respectively. The operational flags 38 are stored in latches 2300 and 2301 which are responsive to flag latch enabling signals F5 and F6 for (1) resetting both latches 2300 and 2301 in response to decoding a "reset + operation" flag at gate 1005 and (2) resetting latch 2300 upon decoding a "reset × operation" flag at NAND gate 1006. Further, latches 2300 and 2301 are responsive to a decoded "load operation flag" from NAND gate 1008 for loading latches 2300 and 2301 with the KL4 and KL8 bits from key latches 2603 and 2604.

A first latch 2600, whose contents may be used to condition a branch instruction is implemented in debounce and PUC logic 44. One function of first latch 2600 is subsequently discussed with reference to debounce and PUC logic 44.

INSTRUCTION REGISTER

Instruction Register 33 is implemented as a series of nine latches 2008-2017. These latches are enabled by an enabling signal generated by NOR gate 2018 at time 914 unless (1) branch latch 2000 is set indicating the instruction word is an address or (2) NOR gate 2001 is a logical one indicating a BRANCH, CALL, DONE, or RETURN instruction is being outputted. As has been previously mentioned, instruction register 33 is not loaded with either a branch instruction or a branch address instruction thereby eliminating the need for the decoders responsive to the address contained in instruction register 33 from being disabled on such instructions.

Latches 2008-2017 normally recirculate the instruction word stored therein on the phase $\phi 3$ and phase $\phi 4$ precharge cycles of the NOR gates and inverters in each latch and each latch is automatically zeroed on time signal 914 received from inverter 2019 unless loaded with a new instruction word under control of gate 2018. Thus when either a BRANCH, CALL, DONE, or RETURN instruction or a branch address instruction is being decoded, instruction register 33 is automatically loaded with a 000000000 as the instruction word which is treated as a No-Operation instruction.

As can be seen, NOR gate 2018, branch latch 2000 and NAND gates 902 and 903 cooperate to provide an instruction word decoder logic means responsive to at least a portion of each outputted instruction word for generating the enabling signal, which controls whether or not instruction register 33 is loaded with the outputted instruction word. The decoders used to decode the outputted instruction word are either responsive to the instruction word directly from ROM 30 or the instruction word in register 33 as discussed previously with reference to the instruction word decoder logic.

KEYBOARD PROGRAMMED LOGIC ARRAY, KEYBOARD LATCHES AND INSERTION LOGIC

The keyboard strobe 42 strobes the keyboard 2 (FIG. 2) at state times STA-STF which are generated on chip by the chip's clock generator system. The periods of these state time signals has been previously discussed with reference to FIGS. 4a and 4b. When a key is depressed, the state time signals STA-STF are communicated to one of four K lines, K1-K4, depending on which key is depressed. The K line inputs to chip 10 (FIG. 2) are buffered by a pair of inverters 2400 and 2401 and are subsequently applied to keyboard programmed logic array (PLA) 41 (FIG. 25). Referring now to FIG. 25, PLA 41 is responsive to the buffered keyboard outputs from inverters 2400 and 2401 and to state times STA-STF from the clock generator system for decoding which one of the keys has been depressed. PLA 41 also outputs, via gate 2500, a key-ready (KYRD) signal indicating that a key has been depressed. PLA 41 outputs a five bit code on lines KLI1, KLI2, KLI4, KLI8, and KLI16 indicating which one of the keys has been depressed. Table III shows the various five bit codes outputted by PLA 41 in response to the key depressions listed. The five bit key codes reading from left to right are stored in latches 2605 through 2601. Of course, the particular five bit codes selected as well as the arithmetic functions performed by the chip are a design choice.

The five bit code outputted from PLA 41 is communicated to the key memory latches 39 formed by five latches 2601-2605. The KYRD signal is an input at NAND gate 2607 which, at time 803, may output a signal called KEYIN. KEYIN is supplied to gate 1904 for forcing the contents of the key latches 39 to be inputted to program counter 31 when KTPC is generated. Upon receiving KYDR signal, the key latches 2601-2605 are loaded from the keyboard PLA 41 and the contents thereof loaded into program counter 31 as been previously discussed with respect to FIGS. 8a and 8b.

When the key latches are used to provide the program counter address, the five key latches 2601-2605 are loaded into selected bit locations in program counter 31 as discussed with reference to FIGS. 8a and 8b. If the five bit code in key latches 2601-2605 has a zero in the KLI16 latch, 2605, the program counter address is derived directly from all five key latches 2601-2605. However, when key latch KLI16 is loaded with a logical one (which preferably indicates a numeric key or the decimal point key has been depressed), only the contents of that latch, latch 2605, is loaded into the program counter by the action of gates 2700-2703 which disable the parallel data path between key latches 2601-2604 and program counter 31. This feature of the calculator permits numbers to be entered into register A by branching to a single location in ROM 30 and thereat encountering instructions for loading the contents of the key latches directly into register A. The instruction used to transfer the contents of the key latches to Register A is defined in Section G of Table I.

DEBOUNCE LOGIC

Upon receiving the key read signal KYRD, a key-ready latch 2608 is set which disables gates 2607 and 2609 from receiving another key-ready. Key-ready latch 2608 inhibits the loading of key latches 2601-2605 (and thus program counter 31) until key-ready latch 2608 is reset. Key-ready latch 2608 is reset by CLR from debounce latch 2606 which will reset key-ready latch 2608 only if (1) the DONE instruction at the end of the set of instructions to which the current contents of key latches 2601-2605 caused program counter 31 to increment through has been decoded and (2) the keyboard sees no KYRD signal during the next period comprising state times STA to STG. If those two conditions are satisfied, debounce latch 2606 will permit key-ready latch 2608 to reset which in turn permits gates 2607 and 2609 to receive another key-ready signal for loading the key latches 2601-2605 and program counter 31 in response thereto.

While the debounce latch 2606 is responsive to the decoding of a DONE instruction, which is located at the end of a set of instructions for performing the calculator operation indicated by the key depressed, successful operation of debounce logic is not dependent on the instruction to which debounce latch 2606 is responsive being at the very end of the instruction set. However, the instruction to which debounce latch 2606 is responsive should preferably be toward the end of the set of instructions and is at the end in this embodiment.

A "first" latch 2600 is used in connection with a first latch condition branch instruction loaded into read-only-memory 30 for permitting a softward power-up clear set of instructions to zero the contents of the memory register, Register M, only the first time the clear key (c) is depressed. The "first" latch 2600 is set the first time debounce latch 2606 resets key-ready latch 2608. The clear key is initially depressed when the calculator is energized, because the calculator preferably uses a power latch of the type disclosed in U.S. pat. application Ser. No. 695,886 filed June 14, 1976 and which is assigned to the assignee of this invention. Thus, the "clear" key and the "on" keys are the same key and only the first depression of the "clear" key will zero the contents of REgister M if the power-up clear instruction set makes appropriate use of a branch condition on the state of first latch 2600.

A power-up clear signal, PUC, is generated preferably by a clock generator 51 when the calculator is first energized until the clock phases produced by clock generator 51 have come up to proper voltages.

DISPLAY LOGIC

Figure 28:
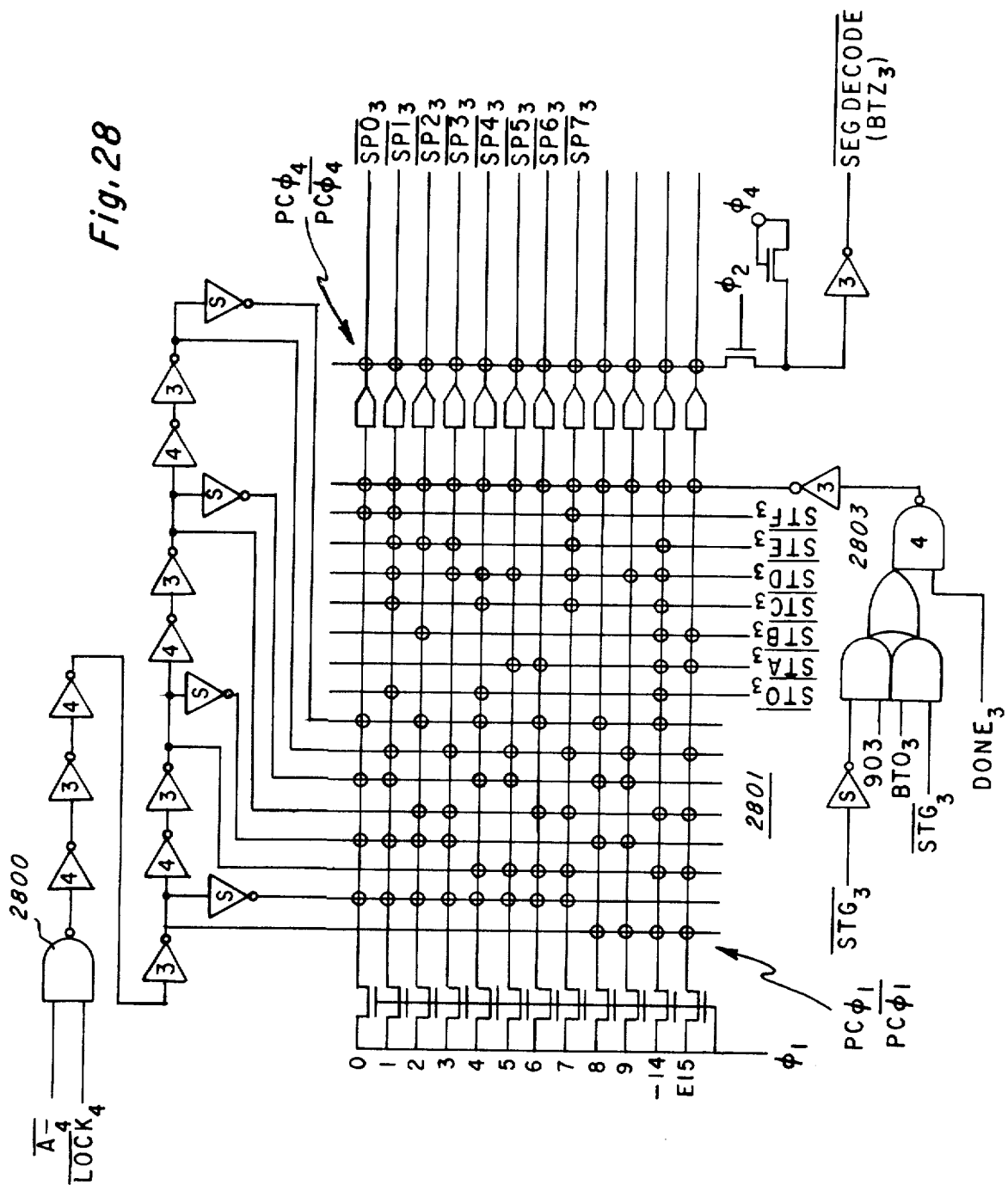
FIGS. 28 and 29 are logic diagrams of the calculator's display system.
Figure 29:
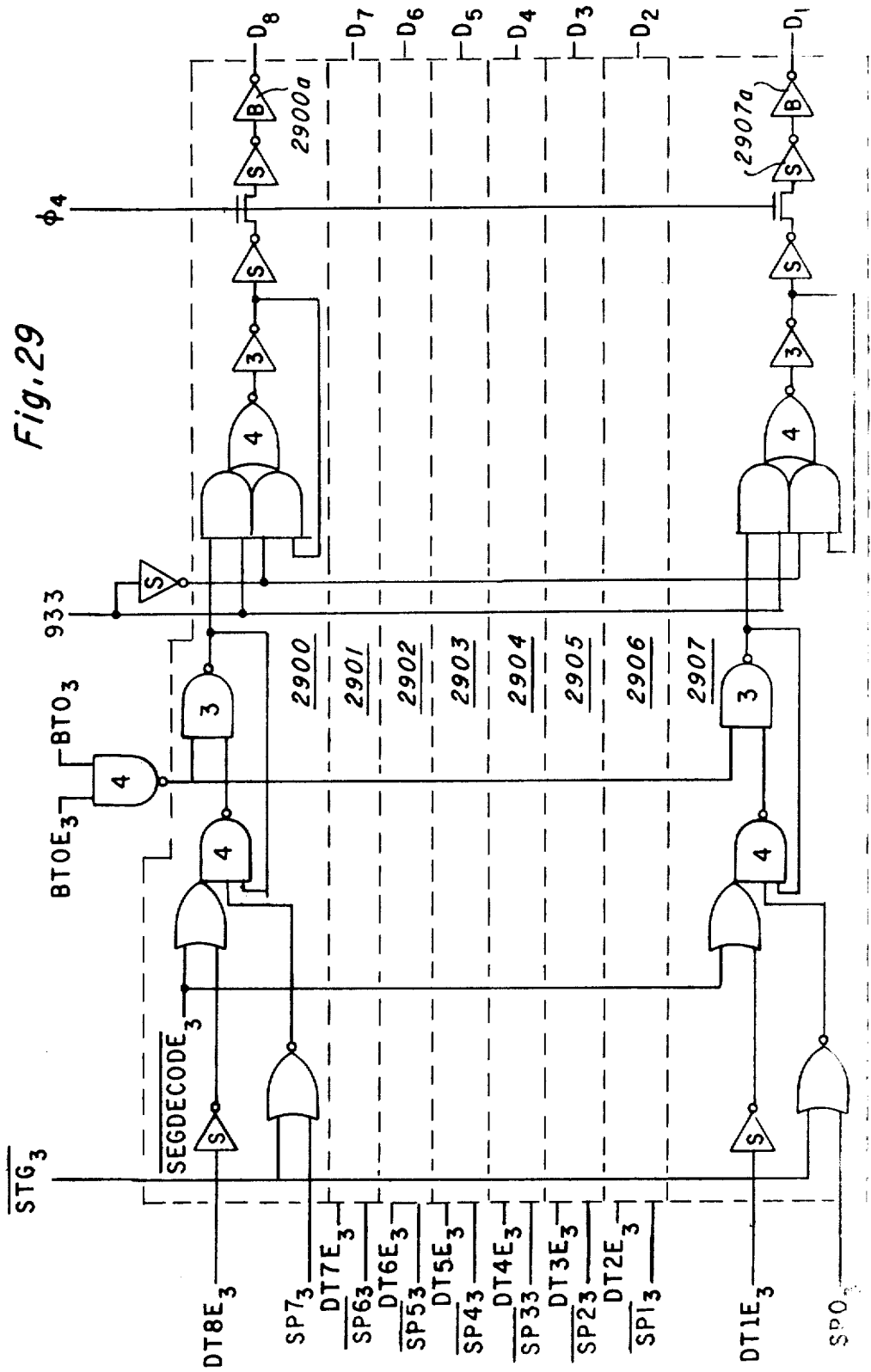

Display logic 52 is depicted in FIG. 28. NAND gate 2800 is responsive to the output from register A and to the contents of the lock flag latch 2203. It should be remembered that the lock flag latch 2203 stores a flag indicating an overflow condition and by means of NAND gate 2800 the error condition indicated by the lock flag is automatically generated at the display. The display system utilizes the segment scanning method of U.S. Pat. No. 4,014,012 and thus the segments of the display are sequentially energized at state times STA-STG and STP while the digit lines are encoded. The encoding function is performed by digit decoder 2801 which is responsive to the output from NAND gate 2800 after being converted from serial to parallel, in true and false logic, by a shift register 2802. Decoder 2801 is also responsive to state times STA-STG and STP and to an enabling signal generated by gates 2803. The eight outputs from decoder 2801, SP0-SP7, are supplied to an eight stage output register, comprising stages 2900-2907. Output register 2900-2907 include output buffers 2900A-2907A for driving digit lines D1-D8 (FIGS. 2 and 5b).

Having described the invention in connection with certain specific embodiment thereof, further modification may now suggest itself to those skilled in the art. For example, it should be evident that the number of bits in a data word or an instruction word, nominal clock frequency, and logic levels, as well as other aspects of the disclosed calculator, are based on a design device. It should be understood that this invention is not limited to the specific embodiments disclosed, except as set forth in the appended claims.

TABLE I

A. BRANCH INSTRUCTIONS - See FIG. 6(a).

| COND | | |
|---|---|---|
| 00000 | Branch | Unconditionally (S=O) |
| 00001 | " | on LE flag |
| 00011 | " | on PEND flag |
| 00101 | " | on LOCK flag |
| 00110 | " | on DPT flag |
| 00111 | " | on STO flag |
| 01001 | " | on EN flag |
| 01011 | " | on CARRY LATCH |
| 10000 | " | on "O" key (key latches) |
| 10001 | " | on "." key (key latches) |
| 10100 | " | on ×, ÷ operation (OP flags) |
| 10101 | " | on − operation (OP flags) |
| 10110 | " | on ÷ operation (OP flags) |
| 11000 | " | on ×, ÷ key (key latches) |
| 11001 | " | on − key (key latches) |
| 11010 | " | on ÷ key (key latches) |
| 11110 | " | on first latch |

S
0   Branch on status=0
1   Branch on status=1

B. SUBROUTINE AND DONE INSTRUCTIONS- See FIG. 6(b)
COND
01010   DONE
11100   CALL
11101   RETURN

C. ARITHMETIC INSTRUCTIONS
i. Reg A plus a constant (A+K) - See FIG. 6(c)
A/φ
0   Result ignored, Reg A recirculates
    Result to Reg A
M
Mask - See FIG. 5(b)
K
4 bit constant
ii. Reg A and Reg B operations (A±B) - See FIG. 6(d)
M
Mask - See FIG. 5(b)
+/−
0   A+B
1   A−B
A/φ
0   Results to Reg A
1   Results ignored, Reg A recirculates D. SHIFT INSTRUCTIONS - See FIG. 6(e).
L/R
0   Left shift contents of Reg A within MANT mask
1   Right shift contents of Reg A within MANT mask

TABLE I-continued

E. REGISTER INSTRUCTIONS - See FIG. 6(f).

T/X
- 0: Transfer operation (A→M means contents of A is placed in M and also is recirculated in A)
- 1: Exchange operation (A/M means contents of A and M are exchanged)

R
- 000: A→B
- 001: A→C (T/X=0 only)
- 010: C→A
- 100: B→C
- 101: B→D
- 011: M→A
- 110: 0→A (Clears Reg A; T/X=0 only)

F. FLAG INSTRUCTIONS - See FIG. 6(g)

S/R
- 0: Set Flag
- 1: Reset Flag

F
- 000: LE Flag (F0)
- 001: PEND Flag (F1)
- 010: LOCK Flag (F2)
- 011: DPT Flag (F3)
- 100: STO Flag (F4)
- 101: Reset + Operation flag (F6)
- 110: Reset × Operation flag (S/R=1 only) (F7)
- 110: Load + and ×Operation flags from KB latches (S/R=0 only)
- 111: EN Flag (F8)

G. KEY LATCH TO REGISTER A - See FIG. 6(h)
Contents of key latches are loaded into Reg A under LSD Mask

TABLE II

| Program Counter Address (in hexidecimal) | INSTRUCTION WORD | Line No. | Dest | Source | | Statement |
|---|---|---|---|---|---|---|
| 01FF | 0 0001 1111 0000 | 4 | | PFRRTN | CALL | |
| 00FF | 0 0000 0001 0110 | 5 | 503 | | PRENM6 | |
| 007F | 0 0001 1111 0000 | 6 | | | CALL | |
| 003F | 0 0001 1101 0001 | 7 | 27 | | POSTN8 | |
| 001F | 0 0001 1111 0000 | 8 | | | CALL | |
| 000F | 0 0000 1001 1001 | 9 | 35 | | POSTN1 | |
| 0107 | 0 0000 0110 0010 | 10 | | | STCA | |
| 0183 | 0 0000 0110 1011 | 11 | | | EXAM | |
| 01C1 | 0 0001 1000 0010 | 12 | | | BRU | |
| 01E0 | 0 0001 0110 0111 | 13 | 76 | | SQRT10 | |
| 00F0 | 0 0001 1111 0000 | 14 | | REVKEY | CALL | YES |
| 0178 | 0 0000 0101 1001 | 15 | 501 | | PRENRM | |
| 01BC | 0 0001 1001 1111 | 16 | | | RSSTO | |
| 01DF | 0 0000 1010 0011 | 17 | 84 | | EXCKEY | |
| 01EF | 0 0000 0110 1000 | 18 | | REVKY1 | EXAB | |
| 01F7 | 0 0001 1000 0010 | 19 | | | BRU | |
| 00FB | 0 0001 0001 1111 | 20 | 23 | | DISPLAY | |
| 0070 | 0 0000 0110 1011 | 21 | | MEMSTO | EXAM | |
| 003E | 0 0000 0110 0011 | 22 | | MEMRCL | STMA | |
| 011F | 0 0000 0101 1111 | 23 | | DISPLAY | REM | |
| 008F | 0 0000 0101 1000 | 24 | | POSTNM | RLE | |
| 0147 | 0 0001 1111 0000 | 25 | | POSTN7 | CALL | |
| 01A3 | 0 0000 0001 0110 | 26 | 503 | | PRENM6 | |
| 0101 | 0 0000 0110 0001 | 27 | | POSTN8 | STAC | |
| 00E8 | 0 0000 0101 1100 | 28 | | SAVSGN | RSTO | |
| 0074 | 0 0000 1010 1000 | 29 | | | AKA | OVF,8 | ANS NEG ? |
| 013A | 0 0001 1010 1110 | 30 | | | BRCARRY | NO |
| 019D | 0 0001 0011 0011 | 31 | 34 | | SAVSN1 | |
| 00CE | 0 0000 0101 0100 | 32 | | | SSTO | YES, SET STO FLG |
| 0067 | 0 0000 0010 1000 | 33 | | | AKAA | OVF,8 | ZERO OVF DIGIT |
| 0131 | 0 0001 1111 0100 | 34 | | SAVSN1 | RETURN | |
| 0099 | 0 0000 1011 1000 | 35 | | POSTN1 | AKA | OPT,8 | FRACTION ? |
| 004C | 0 0001 1010 1110 | 36 | | | BRCARRY | |
| 0026 | 0 0000 0110 0101 | 37 | 257 | | POSTN2 | NO |
| 0015 | 0 0001 0010 0011 | 38 | | | HSA | YES |
| 0009 | 0 0000 0011 1111 | 39 | | | AKAA | OPT,15 | SHIFT RIGHT, DECR OPT |
| 0104 | 0 0001 1000 0010 | 40 | | | BRU | |
| 0082 | 0 0000 1001 1001 | 41 | 35 | | POSTN1 | |
| | | 42 | | | ORG | >41 | SQRT 44 INSTRU |
| 0041 | 0 0001 1111 0000 | 43 | | SQRT | CALL | |
| 0120 | 0 0000 0101 1001 | 44 | 501 | | PRENRM | |
| 0090 | 0 0000 1010 1000 | 45 | | | AKA | OVF,8 | NEG ARG ? |
| 014A | 0 0001 1010 1111 | 46 | | | RSCARRY | |
| 00A4 | 0 0000 0000 1100 | 47 | 264 | | ERROR | YES |
| 0052 | 0 0000 0110 1010 | 48 | | | EXAC | NO, ARG TO C |
| 0129 | 0 0001 1000 1110 | 49 | | | BRPEND | |
| 0194 | 0 0000 1110 0101 | 50 | 52 | | SQRT9 | |
| 01CA | 0 0000 0110 1101 | 51 | | | EXBD | PENDING TO D |
| 00E5 | 0 0000 0110 0000 | 52 | | SQRT9 | STAR | A = 1 |
| 0172 | 0 0000 0001 0001 | 53 | | | AKAA | MSD,1 | A = ANS, B = 1, C = ARG |
| 01B9 | 0 0000 0110 1000 | 54 | | | EXAB | A = ANS, B = 1, C = ARG |
| 00DC | 0 0000 0011 1011 | 55 | | | AKAA | OPT,11 | INIT OPT ANS = 11 |
| 016E | 0 0000 0110 1010 | 56 | | SQRT1 | EXAC | |
| 00B7 | 0 0000 0011 0001 | 57 | | | AKAA | OPT,1 | INCR OPT ARG |
| 0054 | 0 0001 1010 1111 | 58 | | | BSCARRY | |
| 0020 | 0 0001 0111 0011 | 59 | 439 | | SQRT3 | EVEN EXP |
| 011A | 0 0000 0011 0001 | 60 | | | AKAA | OPT,1 | |
| 016H | 0 0001 1010 1111 | 61 | | | BSCARRY | |
| 01C5 | 0 0000 1110 0111 | 62 | 438 | | SQRT2 | ODD EXP |
| 01E2 | 0 0000 0110 1010 | 63 | | | EXAC | |
| 00F1 | 0 0000 0011 1111 | 64 | | | AKAA | OPT,15 | DECR OPT ANS |
| 0078 | 0 0001 1000 0010 | 65 | | | BRU | |
| 013C | 0 0001 0110 1110 | 66 | 56 | | SQRT1 | |
| 019E | 0 0001 0000 0011 | 67 | | SQRT7 | LBA | |
| 01CF | 0 0000 0110 1010 | 68 | | | EXAC | |

TABLE II CONTINUED

| Hex | Binary | Line | Label | Op | Operand | Comment |
|---|---|---|---|---|---|---|
| 01E7 | 0 0001 0010 0011 | 69 | SQRT8 | RSA | | |
| 01F3 | 0 0000 0011 0010 | 70 | | AKAA | DPT,2 | |
| 00F9 | 0 0000 0110 1010 | 71 | | EXAC | | |
| 007C | 0 0001 1010 1110 | 72 | | BRCARRY | | |
| 013E | 0 0000 1011 1001 | 73 | 440 | SQRT4 | | |
| 019F | 0 0000 0110 0110 | 74 | | CLRA | | |
| 00CF | 0 0000 0110 1000 | 75 | | EXAB | | |
| 0167 | 0 0001 1000 1110 | 76 | SQRT10 | BKPEND | | |
| 0183 | 0 0001 0001 1111 | 77 | 23 | DISPLAY | | |
| 0009 | 0 0000 0110 1101 | 78 | | EXHD | | |
| 006C | 0 0001 1000 0010 | 79 | | BRU | | |
| 0036 | 0 0001 0001 1111 | 80 | 23 | DISPLAY | | |
| 011A | 0 0000 0110 1011 | 81 | MEMCLR | EXAM | | MEMORY CLEAR KEY |
| 008D | 0 0000 0110 0110 | 82 | MEMCL1 | CLRA | | |
| 0146 | 0 0000 0011 0111 | 83 | | AKAA | DPT,7 | |
| 00A3 | 0 0000 0110 1011 | 84 | EXCKEY | EXAM | | |
| 0151 | 0 0001 1000 0010 | 85 | | BRU | | |
| 00AB | 0 0001 0001 1111 | 86 | 23 | DISPLAY | | |
| | | 87 | | ORG | >54 | CE/C/ON 41 INSTRU |
| 0054 | 0 0001 1111 1011 | 88 | POWER | BSFIRST | | POWER-UP AND CLEAR MEMORY |
| 012A | 0 0001 1100 0100 | 89 | 95 | CECKEY | | |
| 0095 | 0 0000 0101 1000 | 90 | | RLE | | |
| 004A | 0 0000 1011 1100 | 91 | | RSTO | | |
| 0025 | 0 0000 0110 0110 | 92 | | CLRA | | |
| 0112 | 0 0000 0011 0111 | 93 | | AKAA | DPT,7 | |
| 0189 | 0 0000 0110 1011 | 94 | | EXAM | | |
| 01C4 | 0 0001 1001 1111 | 95 | CECKEY | BSSTO | | |
| 00E2 | 0 0001 0001 1011 | 96 | 81 | MEMCLR | | |
| 0071 | 0 0000 0110 0110 | 97 | NEWNUM | CLRA | | CE/C KEY |
| 003A | 0 0000 0011 0111 | 98 | | AKAA | DPT,7 | |
| 011C | 0 0000 0110 0001 | 99 | | STAC | | |
| 018E | 0 0001 1000 0111 | 100 | | BSLE | | |
| 00C7 | 0 0000 1011 0110 | 101 | 106 | CEKEY | | |
| 0163 | 0 0000 0110 0000 | 102 | | STAB | | CLEAR A, B, D |
| 0161 | 0 0000 0110 0101 | 103 | | STBD | | |
| 00D8 | 0 0000 0101 1101 | 104 | | SAOP | | |
| 016C | 0 0000 0101 1001 | 105 | | HPEN | | |
| 0086 | 0 0000 0101 1011 | 106 | CEKEY | RDPT | | |
| 015B | 0 0000 0101 1010 | 107 | | RLOC | | |
| 00AD | 0 0000 0101 1111 | 108 | | REN | | |
| 0156 | 0 0000 0101 1100 | 109 | | RSTO | | |
| 01AB | 0 0000 0101 1000 | 110 | | RLE | | |
| 0105 | 0 0001 1000 0010 | 111 | | BRU | | |
| 00EA | 0 0001 0101 0100 | 112 | 169 | POSTN3 | | |
| 0075 | 0 0001 0000 0011 | 113 | DIVID3 | LSA | | SHIFT MSD OF A TO OVF |
| 005A | 0 0000 0110 1010 | 114 | | EXAC | | |
| 0110 | 0 0000 0011 0010 | 115 | | AKAA | DPT,2 | |
| 008F | 0 0001 1010 1111 | 116 | | BSCARRY | | |
| 0047 | 0 0001 0100 0010 | 117 | 205 | MLDVEX | | |
| 0123 | 0 0001 0000 0011 | 118 | | LSA | | NO, SHIFT ANS LEFT |
| 0191 | 0 0001 1000 0010 | 119 | | BRU | | |
| 00CA | 0 0000 1011 1110 | 120 | 385 | DIVID2 | | |
| 0064 | 0 0001 0011 1110 | 121 | ALGND1 | SAB | DPT | EXP A .GE. EXP B |
| 0032 | 0 0000 0110 1000 | 122 | | EXAB | | |
| 0119 | 0 0001 1010 1111 | 123 | | BSCARRY | | |
| 008C | 0 0000 1111 0110 | 124 | 182 | ALGND2 | | EXP EQUAL |
| 0046 | 0 0001 0010 0011 | 125 | | RSA | | EXP A .GT. EXP B, SHIFT A |
| 0023 | 0 0000 0011 1111 | 126 | | AKAA | DPT,15 | |
| 0111 | 0 0001 1000 0010 | 127 | | BRU | | |
| 0088 | 0 0000 0101 1101 | 128 | 345 | ALGNDP | | |
| | | 129 | | ORG | >44 | % 2 INSTRU |
| 0044 | 0 0001 1000 0010 | 130 | | BRU | | |
| 0022 | 0 0000 0010 0000 | 131 | 143 | PERCNT | | |
| | | 132 | | ORG | >11 | REV 2 INSTRU |
| 0011 | 0 0001 1000 0010 | 133 | | BRU | | |
| 000A | 0 0000 1111 0000 | 134 | 14 | REVKEY | | |
| | | 135 | | ORG | >4 | = 2 INSTRU |
| 0004 | 0 0001 1000 0010 | 136 | | BRU | | |
| 0002 | 0 0000 0101 1001 | 137 | 501 | PRENRM | | |
| | | 138 | | ORG | >1 | STO 63 INSTRU |
| 0001 | 0 0001 1001 0111 | 139 | MEMSET | BSLOCK | | |
| 0100 | 0 0001 1101 1000 | 140 | 180 | FINISH | | |
| 0080 | 0 0000 0101 0100 | 141 | | SBTO | | |
| 0040 | 0 0001 1010 1000 | 142 | | DONE | | |
| 0020 | 0 0001 1111 0000 | 143 | PERCNT | CALL | | |
| 0010 | 0 0000 0101 1001 | 144 | 501 | PRENRM | | |
| 010A | 0 0000 0011 0010 | 145 | | AKAA | DPT,2 | |
| 0084 | 0 0001 1010 1110 | 146 | | BRCARRY | | |
| 0042 | 0 0001 1000 1010 | 147 | 150 | PERCT2 | | |
| 0021 | 0 0000 0110 0110 | 148 | PERCT1 | CLRA | | |
| 0110 | 0 0000 0011 0111 | 149 | | AKAA | DPT,7 | |
| 0188 | 0 0000 1011 0001 | 150 | PERCT2 | AKA | DPT,1 | |
| 00C4 | 0 0001 1010 1111 | 151 | | BSCARRY | | |
| 0062 | 0 0000 0010 0001 | 152 | 148 | PERCT1 | | |
| 0031 | 0 0001 1000 1110 | 153 | | BRPEND | | |
| 001A | 0 0001 0001 1111 | 154 | 23 | DISPLAY | | |
| 010C | 0 0001 1101 0011 | 155 | | BSMD | | |
| 0086 | 0 0001 0001 1111 | 156 | 23 | DISPLAY | | |
| 0043 | 0 0000 0110 0101 | 157 | | STBD | | |
| 0121 | 0 0001 1111 0000 | 158 | | CALL | | |
| 0190 | 0 0001 0101 1000 | 159 | 354 | MLDVBN | | |

TABLE II CONTINUED

| | | | | | | |
|---|---|---|---|---|---|---|
| 01CA | 0 0001 1111 0000 | 160 | | | CALL | |
| 00E4 | 0 0001 1101 0000 | 161 | 486 | | MULTP2 | |
| 0072 | 0 0000 0110 1101 | 162 | | PERCT3 | EXBD | |
| 0139 | 0 0000 0110 0101 | 163 | | | STBD | |
| 009C | 0 0001 1000 0010 | 164 | | | BRU | |
| 014F | 0 0001 0001 1111 | 165 | 23 | | DISPLAY | |
| 00A7 | 0 0001 0010 0011 | 166 | | POSTN4 | RSA | NO, SHIFT RIGHT, DECR OPT |
| 0153 | 0 0000 0011 1111 | 167 | | | AKAA | OPT,15 |
| 0049 | 0 0000 0001 1101 | 168 | | | AKAA | MSD,13 INSERT BLANK |
| 0154 | 0 0000 1011 1111 | 169 | | POSTN3 | AKA | OPT,15 NO, OPT LOC = 0 ? |
| 01AA | 0 0001 1010 1110 | 170 | | | BRCARRY | |
| 00D5 | 0 0001 0000 1101 | 171 | 175 | | POSTN5 | YES, FINISHED |
| 006A | 0 0000 1000 1111 | 172 | | | AKA | LSD,15 NO, CHK LSD > 0 ? |
| 0035 | 0 0001 1010 1110 | 173 | | | BRCARRY | |
| 0014 | 0 0000 1010 0111 | 174 | 166 | | POSTN4 | NO |
| 0100 | 0 0001 1001 1110 | 175 | | POSTN5 | BRSTO | |
| 0166 | 0 0001 1011 0000 | 176 | 179 | | POSTN6 | |
| 00C3 | 0 0000 0010 1000 | 177 | | | AKAA | OVF,8 |
| 0161 | 0 0000 0101 1100 | 178 | | ERROR1 | RSTO | |
| 0180 | 0 0001 1111 0100 | 179 | | POSTN6 | RETURN | |
| 010A | 0 0001 1010 1000 | 180 | | FINISH | DONE | ********** |
| 01EC | 0 0000 0101 1000 | 181 | | ALGND8 | RLE | |
| 00F6 | 0 0001 1001 1011 | 182 | | ALGND2 | BSDPT | 1ST NEG ? |
| 017B | 0 0000 1100 0101 | 183 | 285 | | ALGND5 | YES |
| 00BD | 0 0001 1000 0111 | 184 | | | BSLE | NO, 2ND NEG ? |
| 005E | 0 0000 0101 1000 | 185 | 288 | | ALGND6 | YES |
| 012F | 0 0001 0111 0010 | 186 | | ALGND3 | AABA | MANT BOTH POS OR BOTH NEG |
| 0197 | 0 0000 1010 1111 | 187 | | | AKA | OVF,15 |
| 00CB | 0 0001 1010 1110 | 188 | | | BRCARRY | CARRY ? |
| 0165 | 0 0001 0011 1011 | 189 | 194 | | ALGND4 | NO |
| 01B2 | 0 0001 0010 0011 | 190 | | | RSA | YES, SHIFT AND DECR OPT |
| 0109 | 0 0000 0011 1111 | 191 | | | AKAA | OPT,15 |
| 00EC | 0 0001 1010 1110 | 192 | | | BRCARRY | OVERFLOW ? |
| 0076 | 0 0000 0000 1100 | 193 | 264 | | ERROR | YES |
| 013A | 0 0001 1000 0111 | 194 | | ALGND4 | BSLE | NO, GET SIGN OF ANS |
| 0090 | 0 0001 1101 0010 | 195 | 293 | | ALGND7 | |
| 004E | 0 0001 1000 0010 | 196 | | | BRU | |
| 0027 | 0 0001 1110 1001 | 197 | 294 | | ALGND8 | |
| | | 198 | | | ORG | >51 MEMRCL 2 INSTRU |
| 0051 | 0 0001 1000 0010 | 199 | | | BRU | |
| 0028 | 0 0000 0011 1110 | 200 | 22 | | MEMRCL | |
| | | 201 | | | ORG | >14 +/- 66 INSTRU |
| 0014 | 0 0000 0010 1000 | 202 | | CHGSGN | AKAA | OVF,8 + / - KEY |
| 010A | 0 0001 1000 0010 | 203 | | | BRU | |
| 0085 | 0 0001 0100 0111 | 204 | 25 | | POSTN7 | |
| 0142 | 0 0000 0110 1100 | 205 | | MLDVEX | EXCB | |
| 0041 | 0 0001 0011 0010 | 206 | | | AABA | OPT A = EXP 1ST |
| 0150 | 0 0000 0110 1010 | 207 | | MLDVX1 | EXAC | |
| 01AB | 0 0000 1011 1001 | 208 | | | AKA | OPT,9 |
| 0004 | 0 0001 1010 1111 | 209 | | | BSCARRY | |
| 01AA | 0 0001 0111 1110 | 210 | 220 | | MLDVX3 | |
| 00B5 | 0 0000 0011 0001 | 211 | | | AKAA | OPT,1 2ND < 7 |
| 005A | 0 0001 0110 1010 | 212 | | | EXAC | |
| 0120 | 0 0001 1001 1011 | 213 | | | BSDPT | |
| 0196 | 0 0001 0010 0110 | 214 | 227 | | MLDVX4 | |
| 01CB | 0 0000 0011 1111 | 215 | | MLDVX2 | AKAA | OPT,15 DECR 2ND |
| 01E5 | 0 0001 1010 1111 | 216 | | | BSCARRY | |
| 01F2 | 0 0001 0101 0000 | 217 | 207 | | MLDVX1 | |
| 01F9 | 0 0001 1000 0010 | 218 | | | BRU | |
| 00FC | 0 0000 0000 1100 | 219 | 264 | | ERROR | |
| 017E | 0 0000 1011 1000 | 220 | | MLDVX3 | AKA | OPT,8 |
| 01BF | 0 0001 1010 1110 | 221 | | | BRCARRY | |
| 000F | 0 0001 1101 0111 | 222 | 454 | | MLDVX5 | 2ND = 7 |
| 006F | 0 0000 0011 1111 | 223 | | | AKAA | OPT,15 2ND > 7, DECR |
| 0137 | 0 0000 0110 1010 | 224 | | | EXAC | |
| 009A | 0 0001 1001 1011 | 225 | | | BSDPT | |
| 0040 | 0 0001 1100 1011 | 226 | 215 | | MLDVX2 | |
| 0126 | 0 0000 0000 0001 | 227 | | MLDVX4 | AKAA | OPT,1 |
| 0093 | 0 0001 1010 1111 | 228 | | | BSCARRY | |
| 0049 | 0 0001 1010 0100 | 229 | 233 | | MLDVX7 | |
| 0124 | 0 0000 1011 0001 | 230 | | | AKA | OPT,1 |
| 0092 | 0 0001 1010 1110 | 231 | | | BRCARRY | |
| 0149 | 0 0001 0101 0000 | 232 | 207 | | MLDVX1 | |
| 01A4 | 0 0000 0110 0110 | 233 | | MLDVX7 | CLRA | |
| 00D2 | 0 0000 0011 0111 | 234 | | | AKAA | OPT,7 |
| 0169 | 0 0001 1000 0010 | 235 | | | BRU | |
| 01B4 | 0 0001 0011 1011 | 236 | 194 | | ALGND4 | |
| 010A | 0 0000 0001 0001 | 237 | | NUMBR2 | AKA | MSD,2 NUMBER 0-9, IS MSD MINUS ? |
| 01ED | 0 0001 1010 1111 | 238 | | | BSCARRY | YES |
| 01F6 | 0 0001 1101 1000 | 239 | 180 | | FINISH | |
| 01FA | 0 0000 1001 0110 | 240 | | | AKA | MSD,6 NO, NUMBER ? |
| 00FD | 0 0001 1010 1110 | 241 | | | BRCARRY | |
| 007E | 0 0001 1101 1000 | 242 | 180 | | FINISH | YES |
| 013F | 0 0001 1111 0000 | 243 | | | CALL | |
| 009F | 0 0000 1110 1000 | 244 | 28 | | SAVSGN | |
| 004F | 0 0001 0000 0011 | 245 | | | LSA | OK, SHIFT AND INSERT |
| 0127 | 0 0001 0000 0011 | 246 | | | LSA | |
| 0193 | 0 0001 0010 0011 | 247 | | | RSA | |
| 00C9 | 0 0000 0100 0001 | 248 | | | KLA | |
| 0164 | 0 0001 1001 1110 | 249 | | | BRSTO | |
| 00B2 | 0 0000 0101 0110 | 250 | 253 | | NUMBR3 | |

TABLE II CONTINUED

| Addr | Binary | Line | Label/Ref | Mnemonic | Operand | Comment |
|------|--------|------|-----------|----------|---------|---------|
| 0159 | 0 0000 0010 1000 | 251 | | AKAA | OVF,8 | |
| 00AC | 0 0000 0101 1100 | 252 | | RSTO | | |
| 0056 | 0 0001 1001 1010 | 253 | NUMBR3 | BRDPT | | DPT SET ? |
| 012A | 0 0001 1101 1000 | 254 | 180 | FINISH | | NO |
| 0195 | 0 0000 0011 0001 | 255 | | AKAA | DPT,1 | YES, INCR DPT |
| 00CA | 0 0001 1010 1000 | 256 | | DONE | | |
| 0045 | 0 0001 1001 1110 | 257 | POSTN2 | BRSTO | | CHK NEG FLG |
| 0132 | 0 0001 0101 0100 | 258 | 169 | POSTN3 | | |
| 0199 | 0 0000 0010 1110 | 259 | | AKAA | OVF,14 | INSERT LEADING MINUS |
| 00CC | 0 0001 0010 0011 | 260 | | RSA | | SHIFT RIGHT, DECR DPT |
| 0046 | 0 0000 0011 1111 | 261 | | AKAA | DPT,15 | |
| 0033 | 0 0001 1010 1111 | 262 | | BSCARRY | | OVERFLOW ? |
| 0019 | 0 0001 0101 0100 | 263 | 169 | POSTN3 | | NO |
| 000C | 0 0000 0101 0010 | 264 | ERROR | BLOC | | |
| 0006 | 0 0000 0101 1000 | 265 | | RLE | | |
| 0005 | 0 0001 1000 0010 | 266 | | BRU | | |
| 0101 | 0 0001 0110 0001 | 267 | 178 | ERROR1 | | |
| | | 268 | | ORG | >180 | 0-9,, 123 INSTRU |
| 0180 | 0 0001 1001 0111 | 269 | NUMBER | RSLOCK | | |
| 00C0 | 0 0001 1010 1000 | 270 | 180 | FINISH | | |
| 0060 | 0 0001 1001 1111 | 271 | | RSSTO | | |
| 0030 | 0 0000 1100 0110 | 272 | 275 | NUMBR4 | | |
| 0118 | 0 0001 1000 0111 | 273 | | BSLE | | NEW ENTRY ? |
| 018C | 0 0001 0101 0111 | 274 | 388 | NUMBR1 | | NO |
| 00C6 | 0 0000 0101 0000 | 275 | NUMBR4 | SLE | | YES |
| 0065 | 0 0001 1100 0011 | 276 | | BSKO | | LEADING ZERO ? |
| 0131 | 0 0000 0111 0001 | 277 | 97 | NEWNUM | | YES, DONT ACCEPT |
| 009A | 0 0001 1111 0000 | 278 | | CALL | | |
| 014E | 0 0000 0111 0001 | 279 | 97 | NEWNUM | | |
| 0046 | 0 0000 1010 0000 | 280 | | SLE | | |
| 0053 | 0 0001 1100 0111 | 281 | | BSKP | | OPT KEY ? |
| 0029 | 0 0001 0101 0101 | 282 | 590 | OPTKEY | | YES |
| 0114 | 0 0000 0100 0001 | 283 | | KLA | | |
| 01AA | 0 0001 1010 1000 | 284 | | DONE | | |
| 00C5 | 0 0001 1000 0111 | 285 | ALGND5 | BSLE | | 1ST NEG, 2ND NEG ? |
| 0162 | 0 0001 0010 1111 | 286 | 186 | ALGND3 | | YES |
| 0081 | 0 0000 0110 1000 | 287 | | EXAB | | 1ST NEG, 2ND POS |
| 0058 | 0 0001 0111 1110 | 288 | ALGND6 | SAB | MANT | |
| 012C | 0 0001 1010 1111 | 289 | | BSCARRY | | SUBT OK |
| 0046 | 0 0000 1100 1101 | 290 | 498 | ALGND9 | | |
| 014B | 0 0000 0110 1000 | 291 | | EXAB | | |
| 01A5 | 0 0001 0111 1010 | 292 | | SABA | MANT | |
| 01D2 | 0 0000 0010 1000 | 293 | ALGND7 | AKAA | OVF,8 | |
| 01E9 | 0 0001 1111 0100 | 294 | ALGND8 | RETURN | | |
| 01F4 | 0 0001 1000 0010 | 295 | | BRU | | |
| 01FA | 0 0001 0101 0010 | 296 | 409 | OPRRTN | | |
| 01FD | 0 0000 1001 0110 | 297 | PRENM2 | AKA | MSD,6 | |
| 00FE | 0 0001 1010 1111 | 298 | | BSCARRY | | MSD > 9 ? |
| 017F | 0 0000 0111 1011 | 299 | 513 | PRENM1 | | |
| 00BF | 0 0001 1001 0110 | 300 | | BRLOCK | | |
| 005F | 0 0001 0001 0111 | 301 | 303 | PRENM5 | | |
| 002F | 0 0000 0010 1000 | 302 | | AKAA | OVF,8 | |
| 0117 | 0 0000 0101 1010 | 303 | PRENM5 | RLOC | | |
| 008B | 0 0000 0110 0001 | 304 | PRENM4 | STAC | | |
| 0145 | 0 0000 0110 1010 | 305 | PRENM7 | CLRA | | CLEAR C |
| 01A2 | 0 0000 0110 1010 | 306 | | EXAC | | |
| 00D1 | 0 0001 1111 0100 | 307 | | RETURN | | |
| 0068 | 0 0001 1001 1111 | 308 | | BSSTO | | |
| 0034 | 0 0000 0111 1101 | 309 | 21 | MEMSTO | | |
| 011A | 0 0001 1000 1111 | 310 | | BSPEND | | OP PENDING ? |
| 018D | 0 0000 1001 1000 | 311 | 315 | EQUAL2 | | YES |
| 01C6 | 0 0000 0110 1101 | 312 | | EXBD | | NO, CONSTANT |
| 00E3 | 0 0001 1000 0010 | 313 | | BRU | | |
| 0171 | 0 0001 0101 1000 | 314 | 316 | EQUAL3 | | |
| 0088 | 0 0000 0110 1000 | 315 | EQUAL2 | EXAB | | |
| 015C | 0 0000 0110 0101 | 316 | EQUAL3 | STBD | | |
| 01AE | 0 0000 0110 1000 | 317 | | EXAB | | |
| 0007 | 0 0000 1001 1001 | 318 | OPRKY2 | RPEN | | |
| 006A | 0 0001 1101 0011 | 319 | OPRKY3 | BSMD | | |
| 0135 | 0 0001 0101 1000 | 320 | 354 | MLDVSN | | |
| 009A | 0 0001 0101 0110 | 321 | | RRSUB | | |
| 0140 | 0 0000 1101 0011 | 322 | 324 | ADD | | |
| 01A6 | 0 0000 0010 1000 | 323 | SUBT | AKAA | OVF,8 | CHG SIGN OF 2ND FOR SUBT |
| 0003 | 0 0000 0101 1000 | 324 | ADD | PLE | | |
| 0069 | 0 0000 0101 1011 | 325 | | RDPT | | |
| 0134 | 0 0000 1010 1000 | 326 | | AKA | OVF,8 | 2ND OPR NEG ? |
| 019A | 0 0001 1010 1110 | 327 | | BRCARRY | | |
| 01CD | 0 0000 0111 1001 | 328 | 331 | SIGNS | | NO |
| 01E6 | 0 0000 0101 0000 | 329 | | SLE | | YES, ZERO OVF, SET LE FLG |
| 00F3 | 0 0000 0010 1000 | 330 | | AKAA | OVF,8 | |
| 0079 | 0 0000 0110 1000 | 331 | SIGNS | EXAB | | A = 1ST, B = 2ND |
| 003C | 0 0000 1010 1000 | 332 | | AKA | OVF,8 | 1ST OPR NEG ? |
| 011E | 0 0001 1010 1110 | 333 | | BRCARRY | | |
| 01BF | 0 0001 1111 0001 | 334 | 337 | CHKZRO | | NO |
| 01C7 | 0 0000 0101 0011 | 335 | | SDPT | | YES, ZERO OVF, SET DPT FLG |
| 01E3 | 0 0000 0010 1000 | 336 | | AKAA | OVF,8 | |
| 01F1 | 0 0000 1001 1111 | 337 | CHKZRO | AKA | MSD,15 | 1ST = 0 ? |
| 00FA | 0 0000 0110 1000 | 338 | | EXAB | | NO, 2ND = 0 ? |
| 017C | 0 0001 1010 1110 | 339 | | BRCARRY | | |
| 018E | 0 0001 0010 1111 | 340 | 186 | ALGND3 | | |
| 010F | 0 0000 1001 1111 | 341 | | AKA | MSD,15 | |

TABLE II CONTINUED

| | | | | | | |
|---|---|---|---|---|---|---|
| 00EF | 0 0000 0110 1000 | 342 | | | EXAB | |
| 0177 | 0 0001 1010 1110 | 343 | | | BRCARRY | |
| 008B | 0 0001 1110 1100 | 344 | 181 | | ALGNDB | YES |
| 0050 | 0 0001 0011 1110 | 345 | | ALGNDP | SAB | DPT | NO, ALIGN DECIMAL POINTS |
| 002F | 0 0000 0110 1000 | 346 | | | EXAB | |
| 0017 | 0 0001 1010 1111 | 347 | | | BBCARRY | |
| 000B | 0 0000 0110 0101 | 348 | 121 | | ALGND1 | |
| 0105 | 0 0001 0010 0011 | 349 | | | RSA | EXP R .GT. EXP A, SHIFT B |
| 0182 | 0 0000 1011 1111 | 350 | | | AKAA | DPT,15 DECR DPT |
| 00C1 | 0 0000 0110 1000 | 351 | | | EXAB | |
| 0160 | 0 0001 1000 0010 | 352 | | | BRU | |
| 0080 | 0 0000 0101 1101 | 353 | 345 | | ALGNDP | |
| 0158 | 0 0000 0101 1000 | 354 | | MLDVSN | RLE | SET LE FLG IF OPP SIGNS |
| 01AC | 0 0000 0101 1011 | 355 | | | RDPT | |
| 000A | 0 0001 0010 0010 | 356 | | | AABA | OVF |
| 016B | 0 0000 1010 1111 | 357 | | | AKA | OVF,15 |
| 0105 | 0 0001 1010 1110 | 358 | | | BRCARRY | |
| 00DA | 0 0001 1101 1011 | 359 | 362 | | MLDVS1 | |
| 0160 | 0 0000 0101 0000 | 360 | | | SLE | |
| 0186 | 0 0000 0010 1000 | 361 | | | AKAA | OVF,8 |
| 010B | 0 0000 0110 1000 | 362 | | MLDVS1 | EXAB | |
| 00ED | 0 0001 0000 0011 | 363 | | | LSA | |
| 0176 | 0 0001 0010 0011 | 364 | | | RSA | |
| 018B | 0 0000 0110 1000 | 365 | | | EXAB | |
| 0000 | 0 0001 1111 0100 | 366 | | | RETURN | |
| 006E | 0 0001 1101 1010 | 367 | | | BRDIV | |
| 0037 | 0 0001 1101 0000 | 368 | 486 | | MULTP2 | |
| 001B | 0 0000 0101 0011 | 369 | | DIVIDE | SDPT | |
| 0000 | 0 0000 1001 1111 | 370 | | | AKA | MSD,15 DIVISOR = 0 ? |
| 0106 | 0 0001 1010 1110 | 371 | | | BRCARRY | |
| 0063 | 0 0000 0000 1100 | 372 | 264 | | ERROR | |
| 0141 | 0 0000 0110 1000 | 373 | | | EXAB | DIVIDEND TO A, DIVISOR TO B |
| 01A0 | 0 0001 0111 1110 | 374 | | | SAR | MANT |
| 0000 | 0 0001 1010 1111 | 375 | | | BBCARRY | |
| 0168 | 0 0001 1101 1101 | 376 | 379 | | DIVID1 | |
| 0084 | 0 0001 0000 0011 | 377 | | | LSA | |
| 015A | 0 0000 0011 0001 | 378 | | | AKAA | DPT,1 |
| 01A0 | 0 0001 0111 1110 | 379 | | DIVID1 | SAB | MANT |
| 0106 | 0 0001 1010 1110 | 380 | | | BRCARRY | |
| 01EB | 0 0000 0111 0101 | 381 | 115 | | DIVID3 | SUBT FAILED |
| 01F5 | 0 0001 0111 1010 | 382 | | | SARA | MANT |
| 00FA | 0 0000 0110 1010 | 383 | | | EXAC | |
| 0170 | 0 0000 0000 0001 | 384 | | | AKAA | LSD,1 INCREMENT ANS |
| 00BE | 0 0000 0110 1010 | 385 | | DIVID2 | EXAC | |
| 015F | 0 0001 1000 0010 | 386 | | | BRU | |
| 00AF | 0 0001 1010 1101 | 387 | 379 | | DIVID1 | |
| 0157 | 0 0001 1100 0110 | 388 | | NUMBR1 | HRKP | |
| 00AB | 0 0001 1101 1010 | 389 | 237 | | NUMBR2 | |
| 0155 | 0 0000 0101 0011 | 390 | | DPTKEY | SDPT | |
| 00AA | 0 0001 1010 1000 | 391 | | | DONE | |
| | | 392 | | | ORG | >55 DIVIDE 2 INSTRU |
| 0055 | 0 0001 1000 0010 | 393 | | | BRU | |
| 002A | 0 0000 0000 0101 | 394 | 399 | | OPRKEY | |
| | | 395 | | | ORG | >15 MINUS 2 INSTRU |
| 0015 | 0 0001 1000 0010 | 396 | | | BRU | |
| 000A | 0 0000 0000 0101 | 397 | 399 | | OPRKEY | |
| | | 398 | | | ORG | >5 PLUS 65 INSTRU |
| 0005 | 0 0001 1111 0000 | 399 | | OPRKEY | CALL | |
| 0102 | 0 0000 0101 1001 | 400 | 501 | | PRENRM | |
| 0081 | 0 0001 1001 1111 | 401 | | | BBSTO | MEM OP ? |
| 0140 | 0 0001 1011 1010 | 402 | 422 | | MEMOP | YES |
| 00A0 | 0 0001 1010 0111 | 403 | | | BSEN | |
| 0050 | 0 0001 1101 0011 | 404 | 419 | | CHGOP | |
| 0128 | 0 0000 0101 0111 | 405 | | | SEN | |
| 0094 | 0 0001 1000 1111 | 406 | | | BSPEND | OP PENDING ? |
| 014A | 0 0000 0110 1011 | 407 | 319 | | OPRKY3 | YES |
| 0045 | 0 0000 0101 0001 | 408 | | | SPEN | NO |
| 0152 | 0 0001 1011 0001 | 409 | | OPRRTN | AKA | DPT,1 |
| 01A9 | 0 0001 1010 1110 | 410 | | | BRCARRY | |
| 0104 | 0 0000 0111 1010 | 411 | 414 | | OPRRT1 | |
| 01EA | 0 0000 0110 0110 | 412 | | | CLRA | |
| 00F5 | 0 0000 0011 0111 | 413 | | | AKAA | DPT,7 |
| 007A | 0 0001 1001 1111 | 414 | | OPRRT1 | BSSTO | |
| 013D | 0 0001 1111 1111 | 415 | 4 | | MEMRTN | |
| 009E | 0 0000 0110 0000 | 416 | | | STAB | |
| 014F | 0 0001 1110 1110 | 417 | | | BRPEND | |
| 01A7 | 0 0001 0001 1111 | 418 | 23 | | DISPLAY | |
| 01D3 | 0 0000 0101 0110 | 419 | | CHGOP | LOADOPS | |
| 00F9 | 0 0001 1000 0010 | 420 | | | BRU | |
| 0174 | 0 0000 1001 1111 | 421 | 24 | | POSTNM | |
| 01BA | 0 0001 1000 1110 | 422 | | MEMOP | BRPEND | |
| 01DD | 0 0000 0111 0111 | 423 | 425 | | MEMOP1 | |
| 00EE | 0 0000 0101 0101 | 424 | | | STBD | |
| 0077 | 0 0000 0110 0000 | 425 | | MEMOP1 | STAB | |
| 003B | 0 0000 0110 1011 | 426 | | | EXAM | |
| 001D | 0 0000 0110 1000 | 427 | | | EXAB | |
| 000F | 0 0001 1110 0111 | 428 | | | BSKSUB | |
| 0007 | 0 0001 1010 0110 | 429 | 323 | | SUBT | |
| 0105 | 0 0001 0000 0010 | 430 | | | BRKMD | |
| 0181 | 0 0000 1101 0011 | 431 | 324 | | ADD | |
| 01C0 | 0 0001 1111 0000 | 432 | | | CALL | |

TABLE II CONTINUED

```
00E0   0 0001 0101 1000    433   354            MLDVBN
0070   0 0001 1110 1010    434                  BRKDIV
0138   0 0001 1101 0000    435   486            MULTP2
019C   0 0001 1000 0010    436                  BRU
01CE   0 0000 0001 1011    437   369            DIVIDE
00E7   0 0001 0000 0011    438         SQRT2    LSA                    A = ARG, B = 1, C = ANS
0173   0 0000 0110 1100    439         SQRT3    EXCB                   A = ARG, B = ANS, C = 1
0089   0 0001 0111 1010    440         SQRT4    SABA       MANT        ARG = ARG = ANS
005C   0 0001 1010 1110    441                  BRCARRY
012E   0 0001 1000 0100    442   472            SQRT6
0097   0 0000 0110 1000    443                  EXAB                   A = ANS, B = ARG, C = 1
004A   0 0000 0110 1100    444                  EXCH                   A = ANS, B = 1, C = ARG
0125   0 0001 0010 0010    445                  AABA       MANT
0192   0 0000 0110 1100    446                  EXCB
01C9   0 0000 0110 1000    447                  EXAB
01E4   0 0001 0111 1110    448                  SAB        MANT
00F2   0 0001 1010 1110    449                  BRCARRY
0179   0 0000 1001 0001    450   467            SQRT5
00BC   0 0001 0111 1010    451                  SABA       MANT
015E   0 0000 1000 0010    452                  BRU
01AF   0 0000 1011 1001    453   440            SQRT4
0107   0 0000 0110 1010    454         MLDVX5   EXAC
00EB   0 0000 1010 1111    455                  AKA        OVF,15
0175   0 0001 1010 1110    456                  BRCARRY
008A   0 0001 0011 1011    457   194            ALGND4
0150   0 0001 0010 0011    458                  RSA
00AE   0 0000 0011 1111    459                  AKAA       OPT,15
0057   0 0001 1010 1110    460                  BRCARRY
0028   0 0000 0010 1100    461   264            ERROR
0115   0 0001 1000 0010    462                  BRU
008A   0 0001 0011 1011    463   194            ALGND4
                                 464                      ORG        >45     MULTIPLY 59 INSTRU
0045   0 0001 1000 0010    465                  BRU
0122   0 0000 0000 0101    466   399            OPRKEY
0091   0 0000 0110 1000    467         SQRT5    EXAB
004C   0 0000 0110 1100    468                  EXCB
0024   0 0001 0111 1010    469                  SABA       MANT
0012   0 0000 0110 1100    470                  EXCB
0109   0 0000 0110 1000    471                  EXAB
0184   0 0001 0111 0010    472         SQRT6    AABA       MANT
00C2   0 0000 1010 1111    473                  AKA        OVF,15
0061   0 0001 1010 1110    474                  BRCARRY
0130   0 0001 1001 1110    475   67             SQRT7
019A   0 0000 0110 1000    476                  EXAB
01CC   0 0000 0011 1111    477                  AKAA       OPT,15
00E6   0 0001 0010 0011    478                  RSA
0073   0 0000 0110 1000    479                  EXAB
0039   0 0000 0110 1010    480                  EXAC
001C   0 0001 0010 0011    481                  RSA
010F   0 0001 1000 0010    482                  BRU
0087   0 0001 1110 0111    483   69             SQRT8
0143   0 0001 0111 0010    484         MULTP1   AABA       MANT        NO
01A1   0 0000 0110 1010    485         MULTP    EXAC                   CLR C FOR ANS
01D0   0 0000 0000 1111    486         MULTP2   AKAA       LSD,15      DECR LSD
01EA   0 0000 0110 1010    487                  EXAC                   ANS TO A
00F4   0 0001 1010 1111    488                  BSCARRY                WAS LSD > 0 ?
0174   0 0001 0100 0011    489   484            MULTP1
01BD   0 0000 0011 0010    490         MULTP3   AKAA       OPT,2       INCR COUNT
00DE   0 0001 1010 1111    491                  BSCARRY                FINISHED ?
016F   0 0001 0100 0010    492   205            MLDVEX
01B7   0 0001 0010 0011    493                  RSA                    NO, SHIFT ANS
00DH   0 0000 0110 1010    494                  EXAC
006D   0 0001 0010 0011    495                  RSA                    SHIFT 1ST OPR
0136   0 0001 1000 0010    496                  BRU
019B   0 0001 1101 0000    497   486            MULTP2
00CD   0 0001 0111 1010    498         ALGND9   SABA       MANT
016A   0 0001 1000 0010    499                  BRU
0083   0 0001 1110 1001    500   294            ALGND8
0059   0 0001 1000 0110    501         PRENRM   BRLE
002C   0 0001 0100 0101    502   305            PRENM7
0016   0 0001 1001 0111    503         PRENM6   BSLOCK
010B   0 0000 1000 1011    504   304            PRENM8
0185   0 0000 1010 1000    505                  AKA        OVF,8
01C2   0 0001 1010 1110    506                  BRCARRY
00E1   0 0001 1101 1100    507   510            PRENM3
0170   0 0000 0101 0010    508                  SLOC
01BA   0 0000 1010 1000    509                  AKAA       OVF,8
010C   0 0000 1001 1111    510         PRENM3   AKA        MSD,15      MSD = 0 ?
01EF   0 0001 1010 1111    511                  BSCARRY                NO
00F7   0 0001 1111 1101    512   297            PRENM2
007B   0 0001 0000 0011    513         PRENM1   LSA                    YES
003D   0 0001 0000 0011    514                  LSA
001E   0 0001 0010 0011    515                  RSA
010F   0 0000 0011 0001    516                  AKAA       OPT,1       SHIFT LEFT, ADD 1 TO OPT
01A7   0 0000 1011 0001    517                  AKA        OPT,1
01C3   0 0001 1010 1110    518                  BRCARRY
01E1   0 0001 1101 1100    519   510            PRENM3
01F0   0 0000 0110 0110    520         PRENM8   CLRA                   ZERO ARG
01FA   0 0000 0011 0111    521                  AKAA       OPT,7
01FC   0 0001 1000 0010    522                  BRU
01FE   0 0001 0001 0111    523   303            PRENM5
```

TABLE III

| FIVE BIT KEY CODES | KEY |
|---|---|
| 10000 | 0 |
| 10001 | 1 |
| 10010 | 2 |
| 10011 | 3 |
| 10100 | 4 |
| 10101 | 5 |
| 10110 | 6 |
| 10111 | 7 |
| 11000 | 8 |
| 11001 | 9 |
| 11111 | . |
| 00011 | + |
| 00111 | − |
| 01011 | × |
| 01111 | ÷ |
| 00010 | = |
| 00110 | +/− |
| 01010 | % |
| 00001 | M (indicates memory operation follows) |
| 01110 | C/ON |
| 00101 | REV (exchange Register B with display) |
| 01001 | VX |
| 01101 | MR (RECALL Memory) |
| 01100 | OFF |

What is claimed is:

1. A key debounce system for an electronic microprocessor system having a data memory for storing numeric data, an arithmetic unit for performing arithmetic operations on the data stored in said data memory, a program counter, an instruction memory for storing a plurality of instruction words controlling the operation of said microprocessor system, including the controlling the transfer of data from said data memory to said arithmetic unit, one of said plurality of instruction words being outputted once each instruction cycle of said microprocessor system according to an instruction word address in said program counter and keyboard sensing means for interfacing said microprocessor system with a keyboard having a plurality of keys, said key debounce system comprising:

(a) means for loading a starting instruction word address in said program counter, said starting instruction word address being generated according to the sensing of the depression of a key on said keyboard by said sensing means, said starting instruction work address being the first address of a set of instruction words collecting said microprocessor system to perform the function indicated by the key depressed;

(b) means for detecting the reading out of particular instruction word from said instruction memory, said particular instruction word being included among said sets of instruction words; and (c) means for coupling said sensing means and said loading means, said coupling means being disabled after said sensing means has detected a key depression and after said coupling means has coupled information regarding the particular key depressed between said sensing means and said loading means and until:

(i) said detecting means detects the reading out of said particular instruction, and (ii) no additional key depression is detected by said sensing means during a preselected period having a duration of a plurality of said instruction cycles.

2. The key debounce system according to claim 1, wherein said loading means comprises:

(a) key memory means for storing a multi-bit word generated by said keyboard sensing means in response to the key depression, and (b) program counter insertion logic means for inserting at least a portion of said multi-bit word into said said program counter, whereby said program counter is loaded with said starting instruction word address.

3. The system according to claim 2, wherein said particular instruction occurs as the last instruction in said sets of instructions.

4. The system according to claim 3, wherein the last instruction word in said set of instruction words is a done instruction, the done instruction inhibiting said program counter from counting.

5. The system according to claim 4, wherein said disabling means comprises a latch having a set and reset states, the latch being set when said sensing means detects a key depression and being reset when said done instruction is outputted from said instruction memory and said sensing means detects no key depression for a plurality of said instruction cycles, the set state of said latch generating a signal for disabling said loading means.

6. The system according to claim 5, wherein said latch is reset by a debounce latch, said debounce latch having set and reset states, the set state thereof being entered when said sensing means detect a key depression and said reset state thereof being entered when said sensing means detects no key depression for a plurality of instruction cycles after the outputting of a done instruction from said instruction memory.

7. A method of debouncing key pushes at a keyboard connected to an electronic microprocessor system having an instruction memory for storing a plurality of instruction words controlling the operation of said microprocessor system, the instruction words being outputted therefrom once each instruction cycle of said microprocessor system, said method comprising the steps of:

(a) sensing key pushes at said keyboard, (b) loading a memory with a multi-bit code indicative of the particular key depressed at said keyboard, (c) addressing said instruction memory in accordance with the multi-bit code stored in said memory, (d) reading out a set of instruction words for controlling said microprocessor system to perform the operation indicated by the particular key depressed, (e) sensing the reading out of a particular instruction word, said particular instruction word being read out from said instruction memory toward the end of said set of instruction words, and (f) inhibiting the addressing of said instruction memory in response to a further depression of a key at said keyboard unless said particular instruction has been read out of said instruction memory and no additional key depression is sensed for a plurality of instruction cycles thereof.

8. The method according to claim 7, wherein said particular instruction word is at the end of said set of instruction words.

9. A key debounce system for an electronic apparatus having a keyboard, an instruction memory for storing a plurality of instruction words, means for addressing said instruction memory, keyboard logic means for generating a multi-bit code in response to depression of a key at said keyboard and means for transferring at least a portion of said code to said addressing means, said key debounce system comprising:
- (a) means for detecting the reading out of a particular instruction word from said instruction memory; and
- (b) means responsive to said keyboard logic means and to said detecting means for inhibiting a second transfer of said code to said addressing means following an initial transfer of said code to said addressing means until said detecting means detects said particular instruction words.

10. The system according to claim 9, wherein said addressing means addresses said instruction memory once an instruction cycle and wherein said inhibiting means also inhibits a second transfer of said code to said addressing means following an initial transfer of said code to said addressing means for a period of time having a duration of a plurality of said instruction cycles.

11. The system according to claim 10, wherein said particular instruction word occurs towards the end of a set of instruction words read from said instruction memory in response to the depression of a key at said keyboard.

12. The system according to claim 11, wherein said transferring means is responsive to a control signal, wherein said inhibiting means includes a latch circuit having set and reset states, the latch circuit being set when said keyboard logic means senses a key depression and being reset when said particular instruction word is outputted from said instruction memory and no further key depression is sensed for a plurality of said instruction cycles, the set state of said latch circuit providing said control signal to said transferring means, said control signal controlling whether or not codes are transferred from said keyboard logic means to said addressing means.

13. The system according to claim 10, wherein said apparatus includes means for incrementing said addressing means and wherein said particular instruction is a done instruction, the done instruction inhibiting said incrementing means.

14. The system according to claim 13, wherein said transferring means is responsive to a control signal, wherein said inhibiting means includes a latch circuit haing set and reset states, the latch circuit being set when said keyboard logic means senses a key depression and being reset when said particular instruction word is outputted from said instruction memory and no further key depression is sensed for a plurality of said instruction cycles, the set state of said latch circuit providing said control signal to said transferring means, said control signal controlling whether or not codes are transferred from said keyboard logic means to said addressing means.

15. A key debounce system for an electronic apparatus having a keyboard, an instruction memory for storing a plurality of instruction words, means for addressing said instruction memory once an instruction cycle, keyboard logic means for generating a multi-bit code in response to depression of a key at said keyboard and means for transferring at least a portion of said code to said addressing means, said key debounce system comprising means responsive to said keyboard logic means and to said detecting means for inhibiting a second transfer of said code to said addressing means following an initial transfer of said code to said addressing means for a period of time having a duration of a plurality of said instruction cycles.

16. The system according to claim 15, wherein said key debounce system includes means for detecting the reading out of a particular instruction word from said instruction memory and wherein said inhibiting means also inhibits a second transfer of said code to said addressing means following an initial transfer of said code to said addressing means until said detecting means detects said particular instruction word.

17. The system according to claim 16, wherein said particular instruction word occurs towards the end of a set of instruction words read from said instruction memory in response to the depression of a key at said keyboard.

18. The system according to claim 17, wherein said transferring means is responsive to a control signal, wherein said inhibiting means includes a latch circuit having set and reset states, the latch circuit being set when said keyboard logic means senses a key depression and being reset when said particular instruction word is outputted from said instruction memory and no further key depression is sensed for a pluraltiy of said instruction cycles, the set state of said latch circuit providing said control signal to said transferring means, said control signal controlling whether or not codes are transferred from said keyboard logic means to said addressing means.

19. The system according to claim 16, wherein said apparatus includes means for incrementing said addressing means and wherein said particular instruction is a done instruction, the done instruction inhibiting said incrementing means.

20. The system according to claim 19, wherein said transferring means is responsive to a control signal, wherein said inhibiting means includes a latch circuit having set and reset states, the latch circuit being set when said keyboard logic means senses a key depression and being reset when said particular instruction word is outputted from said instruction memory and no further key depression is sensed for a plurality of said instruction cycles, the set state of said latch circuit providing said control signal to said transferring means, said control signal controlling whether or not codes are transferred from said keyboard logic means to said addressing means.

* * * * *